US007567890B1

(12) United States Patent
Warlock

(10) Patent No.: US 7,567,890 B1
(45) Date of Patent: *Jul. 28, 2009

(54) CONVERSION OF MODEL COMPONENTS INTO REFERENCES

(75) Inventor: Arwen Warlock, Waltham, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/879,228

(22) Filed: Jul. 16, 2007

Related U.S. Application Data

(63) Continuation of application No. 10/715,239, filed on Nov. 17, 2003, now Pat. No. 7,324,931.

(51) Int. Cl.
*G06F 9/455* (2006.01)

(52) U.S. Cl. .................. 703/6; 703/7; 703/13; 703/14; 717/107; 717/116; 700/182

(58) Field of Classification Search ............ 703/6, 703/13, 20; 717/116, 107; 700/182; 84/609; 345/762, 968, 736; 715/515, 853, 210
See application file for complete search history.

(56) References Cited

U.S. PATENT DOCUMENTS

| | | | |
|---|---|---|---|
| 5,761,684 A * | 6/1998 | Gibson ..................... 715/210 |
| 6,208,345 B1 * | 3/2001 | Sheard et al. ............. 715/853 |
| 6,208,955 B1 * | 3/2001 | Provan et al. .............. 703/20 |
| 6,219,586 B1 * | 4/2001 | Sakai ....................... 700/182 |
| 7,324,931 B1 * | 1/2008 | Warlock .................... 703/13 |
| 7,412,367 B1 * | 8/2008 | Warlock et al. ............. 703/6 |
| 2002/0080174 A1 * | 6/2002 | Kodosky et al. ........... 345/762 |
| 2003/0159129 A1 * | 8/2003 | Frank et al. ............... 717/116 |
| 2003/0179227 A1 * | 9/2003 | Ahmad et al. ............. 345/736 |
| 2004/0031015 A1 * | 2/2004 | Ben-Romdhane et al. ... 717/107 |
| 2004/0056908 A1 * | 3/2004 | Bjornson et al. ........... 345/968 |
| 2004/0089141 A1 * | 5/2004 | Georges et al. ............. 84/609 |

* cited by examiner

*Primary Examiner*—Paul L Rodriguez
*Assistant Examiner*—Kandasamy Thangavelu
(74) *Attorney, Agent, or Firm*—Lahive & Cockfield, LLP; Kevin J. Canning

(57) ABSTRACT

An automated model componentization feature systematically converts duplicate or otherwise amenable patterns in a model into references. Multiple references are simplified to one unit that contains the otherwise duplicated functionality. Duplicated or selected functionality is identified based on a number of arguments that may be user supplied. These arguments include the level of polymorphism (i.e., which of the sample times, dimensions, and data types can be propagated in) but also the maximum size of the patterns to look for to address the general trade-off of generating few partitions with many blocks or many partitions with few blocks and which modeling constructs are used (e.g., whether Go To/From connections such as in Simulink® are present). Model conversions can result in potentially disjoint partitions.

20 Claims, 28 Drawing Sheets

CONVERSION OF MODEL COMPONENTS INTO REFERENCES

RELATED APPLICATION

This application is a Continuation of U.S. patent application Ser. No. 10/715,239 filed on Nov. 17, 2003, currently issued as U.S. Pat. No. 7,324,931 on Jan. 9, 2008.

FIELD OF THE INVENTION

The present invention relates to a system and method suitable for altering entity relationship models, and more particularly to an automated feature for systematically converting duplicate, or otherwise selected, patterns of model components into references to individual model components.

BACKGROUND OF THE INVENTION

Various classes of graphical models describe computations that can be performed on computational hardware, such as a computer, microcontroller, FPGA, and custom hardware. Classes of such graphical models include time-based block diagrams, such as those found within Simulink®, from The MathWorks, Inc. of Natick, Mass., state-based and flow diagrams, such as those found within Stateflow®, from The MathWorks, Inc. of Natick, Mass., data-flow diagrams, circuit diagrams, and software diagrams, such as those found in the Unified Modeling Language. A common characteristic among these various forms of graphical models is that they define semantics on how to execute the model.

Historically, engineers and scientists have utilized time-based graphical models in numerous scientific areas such as Feedback Control Theory and Signal Processing to study, design, debug, and refine dynamic systems. Dynamic systems, which are characterized by the fact that their behaviors change over time, are representative of many real-world systems. Time-based graphical modeling has become particularly attractive over the last few years with the advent of software packages, such as Simulink®. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), biochemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of graphical models in the development, analysis, and validation of dynamic systems.

Dynamic systems are typically modeled in simulation environments as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

There are four common types of mathematical models used in the study of dynamic systems. The first type of mathematical model describes systems using ordinary differential equations (ODEs) and is depicted in FIG. 1A. The dynamic system 2 specifies a set of two equations: Output 4 and Derivative 6. The Output equation 4 facilitates the computation of the system's output response at a given time instant as a function of its inputs, states, parameters, and time. The Derivative equation 6 is an ordinary differential equation that allows the computation of the derivative of the states at the current time as a function of the inputs, the states, parameters, and time. This class of models is suitable for systems in which it is important to track the system response as a continuous function of time. Such continuous-time systems are commonly representative of physical systems (mechanical, thermal, electrical). For simple systems, it may be possible to use the Output 4 and Derivative equations 6 to obtain a closed-form solution for the output response y(t). But in most complex real world systems, the response of the system is obtained by integrating the states through numerical means.

The definition of an ODE used herein encompasses both implicit and explicit differential equations. The class of ordinary differential equations may require additional equations to define the system being modeled. For example, equations called projections may be required to impose constraints on the differential variables (e.g., states $X_1$ and $X_2$ must fall on the manifold defined by $X_1^2+X_2^2=25$). These constraints can be either applied as a secondary condition or a coupled condition to the differential equation. Although systems including the projections may conventionally no longer qualify as an ODE; they are included here to simplify the categories of systems. Another example is the use of a Jacobian equation that defines partial derivatives with respect to the independent and/or differential variables. The Jacobian equation is typically used when obtaining a linear approximation of a non-linear model or an overall linear model of a set of equations. Jacobian equations are required for some forms of numerical integration, for producing the linear model once the model has reached its steady state operating point, etc. The Output 4 and Derivatives equations 6 may be extended to define other relationships for the block. For example, the Output equation 4 may help manage its states by defining a relationship where it resets the state back to a known quantity at a specific point in time or when a specific condition is seen.

Another type of mathematical model describes systems using difference equations as depicted in FIG. 1B. The dynamic system 8 specifies a set of two equations: Output 10 and Update 12. The Output equation 10 facilitates the computation of the system's output response at a given time instant as a function of the inputs, states at some previous time, parameters, and time. The Update equation 12 is a difference equation that allows the computation of the states at the current time as a function of the inputs, states at some previous time, parameters, and time. This class of models is suitable for systems in which it is important to track the system response at discrete points in time. Such discrete-time systems are commonly representative of discrete-time control and digital signal processing systems. For simple systems, it may be possible to use the Output 10 and Update equations 12 to obtain a closed-form solution for the output response y(t). But in most complex real world systems, the response of the system is solved through recursion. The Output 10 and Update equations 12 are applied repeatedly to solve for the system response over a period of time.

An additional type of mathematical model describes systems using algebraic equations as depicted in FIG. 1C. The dynamic system 14 uses an algebraic equation 16 that needs to be solved at each time to obtain the outputs. While simple systems may allow one to obtain a closed-form solution for the system inputs and outputs, practical algebraic equations may best be solved iteratively using a numerical method involving both perturbations and iterations. Algebraic equation solving techniques used in the context of dynamic system modeling are discussed in greater detail below.

A fourth type of mathematical model is a composite system that has components that fall into the three types of models discussed above. Most complex real-world system models fall into this category. This class of systems has Output, Derivative, Update, and potentially other equations. Solving for the output response of such systems requires a combination of the solution approaches discussed for all of the classes above. One example of a composite system is one described by differential-algebraic equations (DAEs) which contain both differential equations and algebraic equations. Grouped within the composite class of systems are many extensions involving relationships (equations) defined in terms of both outputs and state. For example, one can define a limited integration relationship for a differential variable. This relationship requires a set of equations that includes the Output equation, an Update equation, a Derivative equation, and a Zero-crossing equation. The Zero-crossing equation defines the points in time where the upper and lower limits of the limited integration occur. Another example of an extension is the notion of Enable and Disable equations that define relationships among states or signals when parts of a system are activated and deactivated during execution.

Inherent in the four classes of systems (ODE, difference equations, algebraic equations and composite) is the notion of system sample time. The sample time is the time interval at which the inputs, state, or outputs (collectively referred to as the results) of the system are traced as time progresses. Based on sample times, a system can be described as a discrete-time system, continuous-time system and hybrid system. A discrete-time system is a system in which the evolution of the system results are tracked at finite intervals of time. In the limit as the interval approaches zero, the discrete-time system becomes a continuous-time system. The intervals of time may be periodic or non-periodic. Sometimes, non-periodic rate systems are referred to as non-uniform rate systems meaning that there is no periodic rate at which the response can be tracked. Non-uniform-rate systems can fall into the class of composite systems where an additional equation (GetTimeOfNextVarHit) defines when in the future the other equations associated with the system should be evaluated. A continuous-time system is a system in which the evolutions of the system results are continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements.

If a system has only one sample time, it is said to be single-rate. If a system has multiple sample times, it is said to be multi-rate. Multi-rate systems can be evaluated (executed) using either a single-tasking form of execution or a multi-tasking form of execution. When multi-tasking execution is used, it conforms to rate monotonic scheduling principals as defined by LIU, C. L., and LAYLAND, J. W. *Scheduling Algorithms for Multiprogramming in a Hard-Real-Time Environment*. ACM 20, 1 (January 1973), 46-61. Systems may also be categorized by the type of numerical integration solver being used. A fixed-step system is one that uses a fixed-step solver. Fixed-step solvers typically use explicit methods to compute the next continuous state at fixed periodic intervals of time. A variable-step system is one that is using a variable-step solver. A variable-step solver can use either implicit or explicit methods to compute the next continuous state at non-periodic intervals of time. Generally, variable-step solvers use a form of error control to adjust the interval size such that the desired error tolerances are achieved.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the categories listed above. Therefore, a complex dynamic system may be modeled as an interconnection of various simple dynamic systems. A schematic representation of such an interconnection that has evolved over the years is the graphical model. Such graphical models have now become a standard means in textbooks, design papers, journal articles, and specifications to communicate the details of a dynamic system's behavior.

A graphical model of a dynamic system can be represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant. The source block of a signal writes to the signal at a given time instant when its system equations are solved. The destination blocks of this signal read from the signal when their system equations are being solved. The basic components of a block diagram instance of a graphical model are illustrated in FIG. 2. The block diagram includes a plurality of blocks 20, lines 22 and ports 24 that are interconnected. Those skilled in the art will recognize that the term "blocks" does not refer exclusively to elemental dynamic systems but may also include other modeling elements that aid in readability and modularity of block diagrams.

The theory of Digital Signal Processing (DSP) focuses on modeling signals as sequences of samples. This view naturally fits into the time-based block diagram paradigm by mapping the samples u[n] to discrete-time points $u(t_k)$. This adds the benefit of being able to model the interaction between DSP systems and other classes of time-based systems, e.g. continuous and/or discrete-time control systems.

Put another way, block diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block diagram's start and stop time. The relationships between signals and state variables are defined by sets of equations represented by blocks. These equations define a relationship between the input signals, output signals, state, and time. Inherent in the definition is the notion of parameters, which are the coefficients of the equations.

It is important to note that block diagrams are not exclusively used for representing time-based dynamic systems but also for other models of computation. For instance, flowcharts are block diagrams used to capture process flow and are not generally suitable for describing dynamic system behavior. Data flow block diagrams are block diagrams that describe a graphical programming paradigm where the availability of data (often thought of as tokens) is used to initiate the execution of blocks, where a block represents an operation and a line represents execution dependency describing the direction of data flowing between blocks. As used herein, the term block diagrams means time-based block diagrams used in the context of dynamic systems except as otherwise noted.

Block diagram modeling has spawned a variety of software products such as Simulink® from the MathWorks, Inc. of Natick, Mass., that cater to various aspects of dynamic system analysis and design. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the dynamic system's outputs ("executing" the block diagram), and automatically producing either deployable software systems or descriptions of hardware systems that mimic the behavior of either the entire model or portions of it (referred to herein as "code generation"). Each of the tasks listed above has many intricate details and subtle variations that are explored further below.

Block modeling software includes a number of generic components. Although the discussion contained herein focuses on Simulink® version 5.0 (Release 13) from the MathWorks, Inc. of, Natick Mass., those skilled in the art will recognize that it is applicable to other block modeling software applications. The generic components include a block diagram editor, blocks and a block diagram execution engine. The block diagram editor allows users to perform such actions as draw, edit, annotate, save, and print out block diagram representations of dynamic systems. As noted earlier, blocks are the fundamental mathematical elements of a classic block diagram model. Simulink® extends the classic block diagram models by introducing the notion of two classes of blocks, non-virtual blocks and virtual blocks. Non-virtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models. Simulink® further extends the meaning of a non-virtual block to include other semantics, such as a "merge" block semantic. The merge block semantic is such that on a given time step its output is equal to the last block to write to an input of the merge block. An additional extension provided by Simulink® is the concept of conditional execution. Simulink® contains the concept of conditional and iterative sub-systems that control when in time block methods execute for a sub-section of the overall block diagram.

A block diagram execution engine contributes to the modeling software task of enabling the computation and tracing of a dynamic system's outputs from its block diagram model. An execution engine carries out the task of compiling and linking the block diagram to produce an "in-memory executable" version of the model that is used for generating code and/or simulating or linearizing a block diagram model. Note that execution of the block-diagram is also referred to as simulation. The compile stage involves checking the integrity and validity of the block interconnections in the block diagram. In this stage, the engine also sorts the blocks in the block diagram into hierarchical lists that are used when creating the block method execution lists. In the link stage, the execution engine uses the result of the compiled stage to allocate memory needed for the execution of the various components of the block diagram. The linking stage also produces block method execution lists that are used by the simulation or linearization of the block diagram. Included within the link stage is the initialization of the model which includes the evaluating of "setup" methods (e.g. block start, initialize, enable, and constant output methods). The block method execution lists are generated because the simulation and/or linearization of a model must execute block methods by type (not by block) when they have a sample hit.

After linking has been performed, the execution engine may generate code. In this stage, the execution engine may choose to translate the block diagram model (or portions of it) into either software modules or hardware descriptions (broadly termed code). If this stage is performed, then the stages that follow use the generated code during the execution of the block diagram. If this stage is skipped completely, then the execution engine uses an interpretive mode of execution for the block diagram. In some cases, the user may not proceed further with the execution of the block diagram because they would like to deploy the code outside the confines of the block diagram software. Upon reaching the simulation stage, the execution engine uses a simulation loop to execute block methods in a pre-defined ordering upon a sample hit to produce the system responses as they change with time.

For linearization, Simulink® uses the block method execution lists in a prescribed fashion to produce a linear state space representation of the dynamic system described by the block diagram.

The block diagram editor is the graphical user interface (GUI) component that allows drafting of block diagram models by a user. In Simulink®, there is also a textual interface with a set of commands that allow interaction with the graphical editor. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of sub-systems (discussed further below).

A suite of GUI tools in Simulink® allows users to draft a block diagram model on the corresponding windows. The GUI tools include a block palette, wiring line connection tool, annotation tool, formatting tool, attribute editing tool, save/load tool and publishing tool. The block palette is a library of all the pre-defined blocks available to the user when they are building the block diagram. Individual users may be able to customize this palette to: (a) reorganize blocks in some custom format, (b) delete blocks they do not use, and (c) add custom blocks they have designed. The palette allows blocks to be dragged through some human-machine interface (such as a mouse or keyboard) from the palette on to the window (i.e., model canvas). The graphical version of the block that is rendered on the canvas is called the icon for the block. There may be different embodiments for the block palette including a tree-based browser view of all of the blocks.

The wiring line connection tool allows users to draw directed lines that connect the ports of blocks in the model's window. Lines are also added through various mechanisms involving human-machine interfaces such as the mouse or keyboard. Simulink® also provides various forms of auto-connection tools that connect blocks automatically on user request to produce an aesthetically pleasing layout of the block diagram (especially those with high complexity with large numbers of blocks). The annotation tool allows users to add notes and annotations to various parts of the palette for a block diagram. The formatting tool enables users to perform various formatting operations that are generally available on any document editing tool. These operations help pick and modify the various graphical attributes of the block diagram (and constituent blocks) such as include font-selection, alignment & justification, color selection, etc. The block diagram and all the blocks within the block diagram generally have a set of functional attributes that are relevant for the execution or code-generation. The attribute editing tool provides GUIs that allows these attributes to be specified and edited. The save/load tool allows a created block diagram model to be saved. The saved model can be reopened in the editor at some later juncture through a load mechanism. Simulink® also allows users to save blocks including pre-constructed sub-systems into a separate class of block-diagrams called libraries. Such libraries facilitate reuse of the same block in a number of other block diagrams. The load/save mechanism is specially equipped to handle loading and saving of blocks in a block-diagram that actually reside in libraries.

The publishing tool enables the viewing of the block diagram as a document that can be published in any of the standard document formats (examples: PostScript, PDF, HTML, etc.). Those skilled in the art will recognize that the windows for multiple models and all of the tools mentioned above could potentially be embedded in a single Multi-Document Interface (MDI) for providing a unified software environment.

Those skilled in the art will also recognize that block-diagram packages offer scripting languages for writing out programs that automatically carry out a series of operations that would normally require interaction with the GUI. For example, Simulink® offers a set of commands in MATLAB for carrying out operations such as block addition (add_block), block deletion (delete_block), starting and terminating execution (set_param), modifying block attributes (set_param/get_param), etc.

Simulink® also offers a variety of other GUI tools that improve the ability of users to build and manage large block diagrams. Examples of such GUIs include: (a) a Finder that helps find various objects such as blocks and lines within a block-diagram, (b) a Debugger that helps debug the execution of block-diagrams, (c) a Revision Control UI for managing multiple revisions of the block-diagram, and (d) a Profiler for viewing timing results while executing a block-diagram.

A typical base data-structure for a block may be represented as:

```
class Block {
public:
    //Access methods for setting/getting block data
    . . .
    //Methods for block editing
    virtual ErrorStatus BlockDrawIcon( );
    virtual BlockParameterData BlockGetParameterData( );
    . . .
    //Methods for block compilation
    . . .
    //Methods for block execution
    . . .
    virtual ErrorStatus BlockOutput( )=0;
    virtual ErrorStatus BlockDerivative( )=0;
    virtual ErrorStatus BlockUpdate( )=0;
    . . .
private:
    BlockGraphicalData blkGraphicalAttributes;
    BlockFunctionalData blkFunctionalAttributes;
    BlockCompiledData blkCompiledAttributes;
    BlockExecutionData blkExecutionData;
    . . .
```

Although the example of the data structure above is written in C++, those skilled in the art will recognize that equivalent data structures written in other languages may also be used. The major data fields of the block data structure fall into four categories, a graphical attributes field, a functional attributes field, a compiled attributes field and an execution data field.

The graphical attributes field is responsible for storing information relevant for graphical rendering of the block within its parent block diagram's GUI. Attributes specific to the block icon such as font, color, name, and icon-image are stored in this field. It should be noted that modifying these attributes does not affect the dynamics of the model using this block. The functional attributes field is responsible for specifying block attributes that may potentially affect the dynamics of the model using this block. These attributes are specified for the block as a whole and the input and output ports of the block. Examples of block attributes include block sample times and restrictive flags. Block sample times specify if the block corresponds to an elemental, continuous, discrete, or hybrid dynamic system. If the block is an elemental discrete-time system, then the attribute specifies the spacing between time instants at which the block response should be traced. A restrictive flag disallows the use of blocks in certain modeling contexts. For example, one rhay impose the restriction that there may only be one instance of given block in a model.

Attributes of block ports specify properties of the data that is either available or produced at that port. Block port attributes include dimensions, datatypes, sample rates, and direct feedthrough. Dimension attributes are individual dimensions of a multi-dimensional matrix that is used as a container for data elements. Datatype attributes are the datatype of each element of data in the data container. A complexity attribute is a flag to specify if each data element is real or complex. A sample rate attribute specifies how when the signal corresponding to an input or output port will be used. The port sample times may sometimes be used to implicitly infer the block's sample time. The direct feedthrough attribute is specified only for input ports and indicates whether or not the Output and/or GetTimeOfNextHit equations of the block are a function of the given input. This attribute helps in determining the sequence in which block methods should be executed while executing the block diagram.

The compiled attributes field of the block data structure holds the attributes of the block and its ports that mirror the functional attributes listed above. This field is filled in during block diagram compilation by utilizing the functional attributes of the block in conjunction with the functional and compiled attributes of the blocks that are connected to it. This process of determining the compiled attributes from the functional attributes is termed attribute propagation. Attribute propagation is described in greater detail below in the section on block diagram compilation. The execution data field is mainly responsible for storing the memory locations that are going to serve as sources for block inputs, outputs, states, parameters, and other work areas during execution of blocks.

The block data structure also has a set of associated methods that may be categorized as access methods to data fields, methods used in editing, methods used in compilation and methods used in execution. Access methods to data fields help in setting and getting the various data fields of the block. Methods used in editing are called by the block diagram editor in order to render the block appropriately in the GUI of its parent block diagram. For instance, this set of methods may include a BlockDrawIcon method that determines the shape the block icon has on the GUI. Methods used in compilation are methods that are called by the block diagram compilation engine. They help validate the connections of the block to other blocks on the block diagram. The methods used in execution include a number of different run-time methods that are required for execution. These include the BlockOutput, BlockUpdate, BlockDerivative methods that realize the Output, Update, and Derivative equations discussed earlier in the context of dynamic systems. In addition to these methods, Simulink® includes several other run-time methods, such as the Jacobian, Projection, ZeroCrossings, Enable, Disable, Initialize, EvalParams (check and process parameters), and GetTimeOfNextHit methods. It should be noted that there is no explicit method for algebraic equations because these are represented and processed in a different manner which will be discussed below.

The base data structure for the block specifies the generic fields and interfaces that need to be supported by a block. Some of the methods are purely virtual and have no specific implementation in the base block class. In order to define a specific block (such as an Integrator block), one needs to subclass the base block class and provide explicit definitions for these virtual methods. An example of the subclassing of a block may be seen by examining an Integrator block. FIG. 3 depicts the desired behavior of an Integrator block 30. In order to create the subclass, four major categories of information within the subclass must be specified, the block parameters, the methods used in editing, the methods used in compilation, and the methods used in execution. The elemental dynamic system embodied by the block may be parameterized as illustrated in FIGS. 1A-1C. Each block needs to be able to specify its list of expected parameters. The block diagram editor's Attribute-Editing tool may allow users to specify the parameters for the block when they use it in their models. In the Integrator block example, the block has one parameter that specifies the block's initial condition for the block's state. Regarding the methods used in editing, the subclass needs to specify a method that renders its icon. For example, the Integrator block may implement a method that makes its icon be a box with a "1/s" within the box. Also, the subclass needs to instantiate a method that allows access of the block parameters from the GUI's Attribute-Editing tool. For the Integrator example, this method would allow users to specify the Initial Condition parameter on a GUI for the block. For the methods used in compilation, the subclass needs to instantiate methods that help in the compilation of the block diagram model in which it is placed. These methods help specify the compiled information for the inputs and outputs of the block. For instance, the Integrator block may specify a method that ensures that if the input to the Integrator is a vector, then the output is a vector of the same size. For methods used in execution, the subclass needs to instantiate specific Output, Derivative, and Update methods that represent the block behavior. In the case of the Integrator block, an Output and Derivative method are needed. It should be noted that in Simulink® the Integrator block has additional methods that are not illustrated here. The Output method sets the output to be equal to the state. The Derivative method sets the derivative of the state to be equal to the input.

The specification of these four types of information for the Integrator block subclass may be shown by a reduced form of the Simulink® Integrator block:

```
IntegratorBlock : public Block {
public:
    ErrorStatus BlockDrawIcon( ) {
        //Draw '1/s' on the icon
        . . .
    }
    BlockParameterData BlockGetParameterData( ) {
        //Return initial_condition as block data
        . . .
    }
    ErrorStatus BlockOutput( ){
        //Implement y(t)=x(t)
        . . .
    }
    ErrorStatus BlockDerivative( ){
        //Implement dx(t)/dt =u(t)
        . . .
    }
private:
    double initial_condition;
};
```

It should be noted that block diagram software generally provides open access to the block's data structure to users of the software. This allows users to create and utilize custom block implementations in their models.

Blocks in a block diagram may be virtual or non-virtual. The designation of a block as non-virtual indicates that it influences the equations in the mathematical model for the dynamic system. In the context of block diagram software, it is beneficial to include other virtual blocks that do not affect the equations in the dynamic system's model. Such blocks help improve the readability and modularity of the block diagram and wield no semantic influence on the mathematical model. Examples of such virtual blocks include virtual sub-systems, inport blocks and outport blocks, bus creator blocks and From and Goto blocks.

Modularity may be achieved in a block diagram by layering the block diagram through the use of sub-systems. A sub-system facilitates layering by allowing a collection of blocks to be represented by a single block with input and output signals. The input and output signals of the sub-system are accessible to the constituent blocks within the sub-system. A sub-system is a virtual sub-system if its constituent blocks are moved back into the main block diagram model during the model's execution. Within a virtual sub-system graphical entities, called inport and outport blocks, are provided to define signal connections to the parent block diagram. These inport and outport blocks indicate a tunnel-through signal connection to the parent block diagram.

Additional types of virtual blocks include bus creator blocks and selector blocks. In large models, there may be an extensive set of lines that connect one section of a block diagram to another section. To avoid excessive clutter of lines and improve readability, there is typically a special block called a Bus Creator that helps bundle all of the lines together to form a single bus line. This single bus line then connects the two sections of the model. At the destination end of the line, a block called a Bus Selector helps un-bundle the individual lines so that they can be connected to other blocks.

Other virtual blocks include From blocks and Goto blocks that are special blocks that help avoid graphical clutter, e.g. a line that connects two distant sections of a block diagram. The line is terminated close to its originating point by a From block. At the other end, a new line is drawn from a From block that is hot-linked to the Goto block. Each Goto and From block has an associated tag that describes which blocks are connected together. An important point to be noted is that virtual blocks have neither execution data nor execution methods in their data structure.

Simulink® also provides the user with the ability to extend the simulator by providing the ability to enhance the simulator with blocks that define dynamic systems or are virtual properties. The extension is provided through a language independent API (e.g. C, C++, Ada, Fortran, Assembly, M).

As noted previously, to facilitate modeling fairly large and complex dynamic systems, Simulink® allows users to layer their block diagrams. A sub-system facilitates such layering by allowing a collection of blocks to be represented by a single block with input and output signals. The input and output signals of the sub-system are accessible to its constituent blocks. By nesting sub-systems within each other, one can create block diagrams with arbitrary layers of hierarchy. Ideally a sub-system has no impact on the meaning of the block diagram. Additionally, sub-systems provide a way of grouping blocks together and allowing other block diagram constructs to impose unified control on the constituent blocks. To enhance the modularity of sub-systems, modeling software also allows aggregated list(s) of parameters of the blocks within the sub-system to be accessed from a single GUI, and defines and displays special icons on the sub-systems. The process of defining the parameter list and the special icon is called masking a sub-system.

There are two main types of sub-system blocks, virtual sub-systems and non-virtual sub-systems. Virtual sub-systems serve the purpose of providing the block diagram with a graphical hierarchy. Non-virtual sub-systems behave like an elemental dynamic system with its own execution methods (Output, Update, Derivatives, etc.). These execution methods in turn call the execution methods of the constituent blocks.

The classes of non-virtual sub-systems are:

Atomic sub-systems. These are similar to virtual sub-systems, with the advantage of grouping functional aspects of models at a given layer. This is useful in modular design.

Conditionally-executed sub-systems. These are non-virtual sub-systems that execute only when a precondition is fulfilled:

Enabled sub-systems. These are similar to Atomic sub-systems, except that the constituent blocks only execute when an enable signal feeding the sub-system is greater than zero.

Triggered sub-systems. These are similar to Atomic sub-systems, except that the constituent blocks only execute when a rising and/or falling signal is seen on a triggering signal feeding the sub-system.

Enable with Trigger sub-systems. These are an intersection of the properties of Enabled and Triggered sub-systems.

Action sub-systems. These sub-systems are connected to action-initiator (e.g., an "If" or "SwitchCase" block), a block that explicitly commands the sub-system contents to execute. These sub-systems are similar to Enabled sub-systems except that the management of the "enabling" signal has been delegated to an action-initiator. Action sub-systems define a new type of signal, called an action signal that signifies which sub-systems are commanded to execute by the action-initiator.

Function-call sub-systems. These sub-systems provide a means of collecting blocks into a sub-system that is only executed when called by an owner block. The owner block may compute input signals for the sub-system before calling the sub-system. Additionally, the owner may also read output signals from the sub-system after calling it. Function-call sub-systems define a new type of execution control signal, called a function-call signal that contains no data. It is used to define the execution relationship between the owner block and the function-call sub-system. Function-call owners may also designate themselves as an "interrupt" source. In simulation, they simulate the effects of an interrupt and in code generation they can attach themselves to an (asynchronous) interrupt.

While sub-systems and For sub-systems.

These sub-systems execute the constituent blocks multiple times on a given time step.

Simulink® allows for several forms of block parameters to be defined. There are two general categories of parameters: those parameters that can be modified during simulation and those that cannot be modified. An example of a parameter that may be modified during simulation is the amplitude of a Sine Wave block if configured by the user to allow modification during execution. A parameter such as the amplitude specifies coefficients of the dynamic equation, in this case the amplitude of the sine wave function defined by the Sine Wave block. An example of a parameter that can never be modified during simulation is the sample time of the Sine Wave block. The parameters that can be modified during simulation are further broken down into other categories which include mapping the dialog parameter (e.g. the amplitude) to run-time parameters or converting the dialog parameter to an inlined (non-modifiable) parameter. Run-time parameters can further be mapped to mathematical expressions of tunable Matlab variables or Matlab parameter objects describing properties of the variables (called Simulink®.Parameter's). A global run-time parameter data structure is used within Simulink® to manage the block parameters during the execution of the model.

In addition to block parameters, there are model-wide parameters that are generally associated with the solver. These parameters include aspects such as the time span in which to perform a simulation, the type of solver, and the time span. Simulink® gives the user the ability to adjust solver parameters during model execution. The adjustment of these solver parameters is performed at the start of a time step.

Once a block diagram model has been constructed using the editor, an execution engine allows the model to be solved in order to trace the system outputs as a function of time. The solution of the model, which may be referred to as model execution, is carried out over a user-specified time span for a set of user-specified inputs. Simulation proceeds in four major stages: compilation, link, code generation, and the simulation loop. Alternatively, the execution engine can obtain a linear representation of the model (linearization). The interrelationship between the various stages is illustrated in a flowchart in FIG. 4.

The execution begins when the block diagram 40 is compiled 42. Following the compilation stage, is the model link stage 44 which may also produce linear models 46. Code may or may not be generated 45. If code is generated 48, a decision is made 49 whether to continue the simulation. If the decision is made to continue the simulation the model is simulated/executed through the Simulation Loop 50. If the simulation is not continued, the code may be delivered to a target 52 and executed in an external mode 54. If code is not generated the block diagram may execute in interpretive mode when entering the Simulation Loop 50.

The compile stage marks the start of model execution and involves preparing data structures and evaluating parameters, configuring and propagating block characteristics, determining block connectivity, and performing block reduction and block insertion. The preparation of data structures and the evaluation of parameters creates and initializes basic data-structures needed in the compile stage. For each of the blocks, a method forces the block to evaluate all of its parameters. This method is called for all blocks in the block diagram. If there are any unresolved parameters, execution errors are thrown at this point.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation"), serves two purposes. In the case of a block that has explicitly specified its block (or its ports') functional attributes, propagation helps ensure that the attributes of this block are compatible with the attributes of the blocks connected to it. If not, an error is issued. For instance, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. For instance, a discrete-time Filter block could be implemented to accept any of the standard integer datatypes ranging from 8-bit to 128-bit. The exact implementation of the block is chosen on the basis of the specific block diagram in which this block finds itself. Included within this step are other aspects such as validating that all rate-transitions within the model yield deterministic results and that the appropriate rate transition blocks are being used.

The compilation step also determines actual block connectivity. Virtual blocks play no semantic role in the execution of a block diagram. In this step, the virtual blocks in the block diagram are optimized away (removed) and the remaining non-virtual blocks are reconnected to each other appropriately. This compiled version of the block diagram with actual block connections is used from this point forward in the execution process Once actual block connectivity has been determined (by removing the virtual blocks) the block diagram may be further optimized by performing block reduction and insertion. During this step, non-virtual blocks may be inserted or a set of non-virtual blocks may be completely removed or reduced to a single equivalent block. Block insertion and reduction is mainly done to improve execution efficiency. Examples of block insertion and reduction include the removal of Gain blocks whose gain value is 1.

A Gain block is a block that multiplies its input value by a gain parameter, such as a simple amplifier. FIG. 5 depicts the replacement of a collection of blocks 60, 62, and 64 connected in an accumulator pattern and leading to result 66 with an equivalent synthesized block 68 representing the accumulator pattern leading to the same result 66. A signal copy block may also be automatically inserted in order to make contiguous memory copies of signals that are made up of disjoint memory sections. Block insertion and reduction may also be performed at other suitable stages of compilation.

The way in which blocks are interconnected in the block diagram does not necessarily define the order in which the equations (methods) corresponding to the individual blocks will be solved (executed). The actual order is partially determined during the sorting step in compilation. Once the compilation step has completed, the sorted order cannot be changed for the entire duration of the block diagram's execution.

The first step in sorting involves transforming the graphical block diagram into a compiled (in-memory) directed graph consisting of arcs and vertices. The vertices are derived from some of the non-virtual blocks. For instance, virtual and reduced blocks do not appear in the directed graph. The arcs represent data dependencies between the vertices. The data dependencies do not correspond to the signals in the block diagram. For example, all signals that connect to input ports without direct feed through are "cut" or ignored. In addition, data dependencies are added to capture implicit dependencies. For example, all inputs to a Function-Call sub-system are implicit data dependencies to the owner (caller) block.

The process of converting a block diagram into a compiled directed graph is shown in FIG. 6A. A block diagram 81 includes a Sine Wave 1 block 82, a Sine Wave 2 block 84, a Goto block 86, a Function Call Generator block 88, and a From block 90. Also included are a Function Call Sub-system block 92, a Sum block 94, a Gain block 96, an Integrator block 98 and an Outport (Output 1) block 100. Those blocks that are not virtual or reduced appear on the corresponding directed graph 111. The directed graph 111 includes a Sine Wavel vertice 112, a Sine Wave 2 vertice 114, a function-call generator vertice 116, and a function call sub-system vertice 118. Also included are a Sum vertice 120, a Gain vertice 122, an Integrator vertice 124 and an Outport 1 vertice 126. The vertices are connected by arcs.

The graph is used to sort the blocks into a linear sorted list. FIG. 6B depicts a sorted list 128 generated from the compiled directed graph 111 which includes the elements appearing as vertices in the directed graph 111 sorted into order. The root block diagram has a sorted-list associated with it. Roughly speaking, each non-virtual sub-system layer and some special block diagram elements also each have their own sorted-list. During the sorting of the graph into the list, strongly connected components are identified. The term strongly connected section, which is a term that originates from graph theory, is a subset, S, of the blocks of a block diagram such that any block in S is reachable from any other block in S by following signal connections and S is not a subset of any larger such set. Strongly connected sections are flagged as algebraic loops when all blocks have direct feedthrough (an example is shown in FIG. 6A consisting of the Sum 120 and Gain 122 blocks). Such loops correspond to a set of algebraic equations and are solved using iterations and perturbations during block diagram execution by solving for the algebraic variables. Algebraic variables are either specified by the user via Initial Condition blocks or chosen by the execution engine. Solving of algebraic loops is discussed further below.

Sorting must also take into consideration other user specified dependencies between the blocks. These dependencies include the concepts of priorities and placement groups. A block priority specifies the order in which the equations associated with a block are evaluated with respect to other blocks. Placement groups are a way of causing each class of block methods for a specified set of blocks to be "placed together" in the block method execution lists. The terms "data dependency" or "data precedence" as used herein refers to the arcs of the compiled directed graph and not the signals found within a block diagram. Attempting to correlate data dependencies directly to the signals found within a block diagram is incorrect and leads to the conclusion that Simulink® does not satisfy data dependencies, i.e., the execution of the operations or block methods does not satisfy data dependencies if one interprets signal connectivity as specifying data dependencies.

After compilation, the link stage commences. During this stage physical memory allocations are made in order to prepare for execution. Buffers are allocated for block input and output data buffers, states, and work areas. Additionally, block method execution lists that are derived from the sorted list allow for execution of the block diagram. Each block method execution list is a list of block methods that are to be executed in a sequence when each method within the list has a sample hit. There is generally a set of block method execution lists associated with each layer of the block diagram that corresponds to a non-virtual sub-system. Non-virtual sub-systems are either defined by the user or automatically synthesized during compilation to either efficiently execute the model or simplify the implementation of the semantics defined by Simulink®. In multi-tasking mode, the lists within each layer may be further partitioned when block diagrams have blocks with different sample rates. These lists are explained in greater detail below.

Those skilled in the art will recognize that while the block method execution lists are derived from the sorted list, they do not necessarily correspond one-to-one with the sorted lists. First, each block method execution list contains only blocks that have such a block method of the given type (class) defined by the list. Second, block methods corresponding to components like the function-call sub-system do not appear on the block method execution lists because they are executed by an "owner" block.

Although included in the discussion of the compilation stage, it is not required that the time-based diagram perform the block sorting step during compilation. The sorting step is performed to achieve efficient execution. Ignoring efficiency, there is no semantic reason to perform the sorting step. Any random ordering of the block methods will work. In fact, any ordering of all block method execution lists except the Output block method execution list will result in the same level of efficiency. Randomly re-ordering the Output block method execution list will yield correct answers. If the Output block method list is randomly ordered, then the Simulation engine, when executing the Output block method execution list, continues sequencing through the Output block method execution list at each point in time until there are no changes.

Similarly included within the linking stage for the sake of simplicity, is the memory initialization of the model. The memory initialization of the model includes invoking block start, initialize, constant initialize, enable, and constant output methods. These are examples of some of the block methods that are used during model setup (prior to execution) to initialize the "state" of the system so that execution or linearization can commence.

The compiled and linked version of the block diagram may be directly utilized to execute the model over the desired time-span. This interpretive mode of execution is suitable for getting fine-grained signal traceability. It should be noted that the traceability associated with interpretive execution comes at the price of increased overhead in the form of additional execution-related data-structures and messaging in the engine. An alternative to the interpretive execution mode is to utilize the generated-code created by Real-Time Workshop tool for Simulink® models. In this mode, the engine (upon the behest of the user) translates a selected portion of the block diagram (or the entire block diagram itself) into code. Such code could be in a number of possible forms. The code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance.

The execution of a portion of the block diagram represented in code may be performed in a number of different ways based on the specific code format. The portion of the block diagram may execute a compiled version of the code generated in a high-level language (accelerated or software-in-the-loop simulation), the execution may simulate code that corresponds to a hardware description on a hardware simulator, (co-simulation execution), the execution may involve calling out to third-party software to run code generated for such software (co-simulation execution), or the execution may call out directly to hardware that will run code that was generated and compiled for that hardware (processor-in-the-loop execution).

There are several different advantages to execution through code generation: Execution of generated code can be more efficient than interpretive execution because of fewer data-structures and lesser internal messaging in the engine, although the increased efficiency generally comes at the cost of decreased execution traceability. Simulation of hardware descriptions during execution can help identify and resolve bugs in the software stage of a design project. Such bugs prove much more expensive to track and fix once the system has been implemented in hardware. Additionally, block diagram modeling software can be integrated with other software environments that are suitable for modeling and simulating special classes of systems. Models can be tested directly in hardware thereby making prototyping of new systems fast and cost-effective. For instance, consider the design of a controller for an anti-lock braking system of a car. The dynamics of the braking system can be executed in the interpretive mode in the block diagram. The controller itself can be implemented on a hardware micro-controller to test the efficiency of the control laws implemented within. Note that for such target execution, it is normally necessary for the time span over which a model is executed by the software to match real-world time. In other words, the software must allow real-time execution of the block diagram model. Those skilled in the art will recognize that when users generate code, they may choose to not proceed further with the block diagram's execution. They may choose to take the code and deploy it outside of the confines of the modeling software environment. This is normally the last step in the design of dynamic systems in a block diagram software package.

There are several forms of target code execution known to those skilled in the art such as Rapid Prototyping, Embedded System Deployment, and Hardware-in-the-Loop which execute a model or portions of a model via the generated code on a Real-Time System target. One aspect of deploying (executing) the generated code on a target is the notion of "external mode." External mode refers to a system where Simulink® acts as a monitor and debugger of the generated code running in real-time on a target. In External Mode, users can change parameters and view signals via standard Simulink® elements. Another important aspect of the code generation technology is that it is very extensible. Provided with the Simulink® product family is the Target Language Compiler (TLC). This technology enables the creation of "active scripts" that control how the generated code is produced for a block diagram. Using TLC, one can tailor the generated code to suit their specific needs.

The execution of the block diagram uses a Simulation Loop (SimLoop) for solving for the block diagram's outputs for a specified set of inputs over a specified span of time ("Time" in reference to the Simulation Loop means the time-line corresponding to the tracing of the dynamic system's outputs, not real-world time unless otherwise noted). The term "SimLoop" applies to real-time systems where each iteration is tied to a physical periodic clock or other timer source. During this process, the block methods (equations) corresponding to the individual blocks are executed by type following their sorted order when they have a sample hit. The term "block execution" is loosely used to mean executing all block methods associated with the given block for a given time step, generally starting with the output method. Strictly speaking, blocks do not execute; the engine executes (evaluates) the appropriate block methods at the appropriate time points.

SimLoop has two variants "single-tasking" and "multi-tasking" depending on sample times. In general, the sample time of a block is the interval of time between calls to the Output, Update, and/or Derivative methods for a given block. In computing this interval, repeated calls at the same time instant (not in real-world time but the time corresponding to the execution of the dynamic system) are counted as the same call. A block's sample rate may also be thought of as the interval between successive executions of the block methods. If there is no uniform or regular interval between calls, then the block is said have a continuous sample time. If a uniform time interval can be found, then the block is said to have a discrete sample time equal to that interval. Although blocks may be associated with more than one sample time in a sufficiently complex dynamic system the descriptions contained herein are confined to blocks with a single sample-time. Those skilled in the art will recognize that the descriptions may be extended to encompass blocks with multiple sample times.

FIG. 7A depicts an abstract example of a block diagram being executed. The diagram includes a plurality of blocks 140, 142, 144, 146, 148 and 150. The block ports that have direct feedthrough are explicitly marked (using the symbol "df")152. Additionally, an abstract view of the execution methods instantiated by each block is shown in FIG. 7B. The blocks contain a number of different methods 160, 162, 164, 166 and 168. Execution methods includes the three basic execution methods discussed earlier: Output, Update, Derivative, as well as several other methods that aid in advanced block functions such as initialization, linearization and zero-crossing detection.(which are discussed below). The data-dependencies between the compiled vertices created during sorting are used to generate the Sorted List 170 shown in FIG. 7C.

A block diagram consisting of blocks that all have the same sample time is said to correspond to a single-rate system. A block diagram consisting of blocks that have more than one sample time corresponds to a multi-rate system. FIG. 8 depicts a multi-rate system, adding sample-time information to the block diagram of FIG. 7A. The plurality of blocks 140, 142, 144, 146, 148, and 150 each have an associated sample time. Since the sample times in the block diagram differ between blocks, the system is considered a multi-rate system. Block A 140, block E 148 and block F 150 each have a sample time of 0.1 seconds. Block B 142, block C 144 and block D 146 each have a sample time of 1.0 seconds.

The SimLoop is the heart of the execution engine. Each full pass through the loop is responsible for computing the outputs of the system at a particular time. At the end of each loop, the execution time corresponding to the next pass through the loop is computed. If this time exceeds the stop time specified by the user, the execution terminates. Within the loop, the sequence in which individual block equations are solved is determined by two pieces of information: the sample times of the blocks and the sorted order determined during the Compile stage. The amalgamation of these two pieces of information gives the execution lists for the block diagram. Those skilled in the art will recognize that the execution lists are created in the Link stage and are explained in the context of SimLoops for convenience. There are two distinct approaches for building execution lists and using them in the SimLoop. These approaches correspond to the Single-tasking and Multi-tasking SimLoops summarized in the discussion on FIG. 10 below.

Simulink® also has the ability to modify coefficients (parameters) of blocks that declare their parameters as tunable. An example of such a block is a Sine Wave block that implements the function: output (time)=amplitude*sin (frequency*time+phase)+bias, where time is the independent variable and the parameters are: amplitude, frequency, phase, bias. When these parameters are declared as tunable, Simulink® lets the user change these coefficients during simulation. Changing parameters is a drastic operation in that the definition of the model has changed (e.g. the sine block defines equations that describe the system). Thus, to enable the changing of parameters during the SimLoop®, Simulink® first queues parameter changes and then applies them on the next time step. Thus, the changing of parameters is not immediate. The delay in the changing of parameters is needed to ensure system stability. The application of the parameters at the start of the next time step is combined with the reset of the solver (Integrator) if needed.

For the purpose of exploring single-task loops and multi-task loops, FIG. 9 depicts the block diagrams of FIG. 7A and FIG. 8 where Method1 corresponds to the Output method 190 and Method2 corresponds to the Update method 192. All other methods are ignored in the explanation of the loops. Simpler loops which do not include blocks that have continuous sample times are used in the example since the explanation is simpler in the context of discrete sample times and it is straight-forward to extend to continuous sample times.

In a single-tasking SimLoop, there is essentially a single execution time-line. On this time-line, each block is executed when it has a sample hit. A sample hit is defined to be an execution time instant that is an integer multiple of the block's sample time. To aid in execution, execution lists are constructed for each method type. FIG. 10 depicts the sequence of steps followed by a single-tasking execution loop. Following initialization (step 200), a time parameter is checked to see if the current time is less than the stop time (step 201). If the time is not less than the stop time, the simulation ends (step 202). If the time is less than the stop time, the simulation continues and the root output method execution list is executed (step 204). Following execution of the output method list (step 204) the update method execution list is executed (step 206). Following the performance of an integrate step (208) (the Integrate step is described in more detail below in FIG. 14), the time parameter is incremented by the applicable step size (step 210).

Blocks are arranged in the single-tasking execution lists in the sorted order as shown in FIG. 11A. A sorted list 250 is used to generate an Output method execution list 252 and an Update method execution list 254. Referring back to the example in FIGS. 7 and 8, the engine sequentially steps through and execute each block in the block method execution list when the execution time divided by the sample time equals an integer number (1, 2, 3, 4, etc.). At time zero ($T_0$), all the blocks are executed. This involves executing the Output methods for blocks F, E, D, A, B, and C (in this order as dictated by the sorted list) and then executing the Update methods of blocks F, E, and D (again, in this order based on the sorted list). The execution time then is then incremented by step size, which in this case is assumed to be 0.1 seconds. Execution then commences once again at the top of the loop for T=0.1 ($T_{0.1}$). Blocks F and E have a sample time of 0.1 seconds and have a sample hit (0.1÷0.1=1, sample time is an integer multiple of the execution time), so the output block methods for Blocks F and E are executed. Block D, however, has a 1.0 second sample time and has no sample hit (0.1÷1.0=0.1, sample time is not an integer multiple of the execution time), so its output block method is not executed (essentially it is skipped). Block A, like Blocks F and E, has a 0.1 second sample time and so its output block method is executed. Blocks B and C, like Block D, have 1.0 second sample times and are skipped during this iteration of the simulation loop, which completes execution of the output block method execution list for $T_{0.1}$.

The execution timing of the example block diagram in single task mode is shown in the first time-line of FIG. 11B. In this diagram, note that the execution-time is not synchronized with real-world time. Instead, execution time progresses as fast as it can in real-world time. The sorted list 259 is executed on the time-line 260. The methods in the list 262 are executed at the appropriate time step 264. Block diagram modeling software can also allow users to simulate real-world conditions by synchronizing execution time with real-world time. Such execution is illustrated in the second timing diagram of FIG. 11B. The methods 262 are implemented at a time-step 264 synchronized with real world time on the time line 270.

In multitask mode, the engine performs execution along multiple time-lines based upon the number of block sample times used in the mode as shown in the flowchart of FIG. 13. In the example of FIGS. 7 and 8, the model's blocks have a sample time of either 0.1 seconds or 1.0 second. This implies that the engine runs one set of blocks along a 0.1 second time line and another set of blocks along a 1.0 second time line. In order to run in multitask mode, the execution lists are first divided on the basis of methods (as in single-tasking mode) and then subdivided again based upon block sample times. This is illustrated in FIG. 12A. The sorted list 280 is used to generate an output method execution list 282 and update method execution list 288. The output method execution list 282 is split into two separate list execution lists 284 and 286 based on sample times. Similarly, the update method execution list 288 is divided into two update method execution lists 290 and 292 based on sample times.

The execution engine uses the divided execution lists to create multiple execution time lines. In the multitask mode the engine places a higher execution priority on the faster sample time blocks than the slower sample time blocks. This prioritization is carried out by assigning Task Identification Numbers (TIDs) to each execution list; the higher the priority, the lower the TID. For example, a TID of 0 executes at a higher priority than a TID of 1, and so forth. Furthermore, because, during execution in multitask mode, execution transitions between the faster and slower blocks, and vice-versa, the multitask mode requires rate transition blocks that allow the model to transition from blocks running at fast sample times, in our example 0.1 seconds, to slower samples times, e.g., 1.0 seconds. The rate transition blocks are required to correctly simulate how a multi-rate system would behave in a real-time environment. To provide this transition, the engine promotes rate transition blocks to the TID of the fast block for which transition is being provided, although the engine executes these rate transition blocks at their slower rate. This is why Blocks D and B appear in the 0.1 sample time output method execution list in FIG. 12A.

The execution of our example in the multi-task mode may be seen in FIG. 12B. At time T=0, the engine first executes the high priority output methods (those with TID 0) for Blocks F, E, D, A and B, then it executes the high priority update methods (those with TID 0) for Blocks F and E. After finishing the high priority blocks, the engine executes the lower priority output block methods (those with TID 1) for Block C, and then executes the lower priority update methods (those with TID 1), which, in this example, is Block D. In contrast to the single task mode, in multitask mode the engine runs through a TID inner loop to execute the output and update block methods before going on to the Integration step, as the flow chart in FIG. 13 which is discussed below illustrates.

As a result of the inner TID loop, as well as the segregated block method execution lists, the order of execution in multitask mode differs from the order of execution in single task mode. Recall for the example that in single task mode that the order of execution at T=0 is: $F_o, E_o, D_o, A_o, B_o, C_o, F_u, E_u$, and $D_u$, where the subscript "o" stands for output method and the subscript "u" stands for update method. In the multitask mode, however, the order of execution at T=0 is: $F_o, E_o, D_o, A_o, B_o, F_u, E_u, C_o$, and $D_u$. Notice that $C_o$ is executed in a different order in multitasking mode. This occurs because separate method execution lists (based upon sample time) are created and run in order from fastest sample time to slowest sample time. Additionally, the use of rate transition blocks restricts the connection of blocks with different rates. By requiring the insertion of these blocks into the model, the engine ensures that execution in multitask mode will follow the sorted list.

After it is finished executing the block methods for T=0, like in the single task mode, the execution time is incremented (again assume by 0.1 seconds) and execution goes to the beginning of the loop. The engine executes $F_o$, $E_o$, $A_o$, $F_u$, and $E_u$, and the engine does not execute the block methods of Blocks D, B, and C because the current execution time is not an integer multiple of those block's sample time. The engine repeats this execution until the execution time is incremented to 1.0 seconds, whereupon execution occurs in the same manner as described for T=0. The engine repeats this overall process until the execution stop time is reached.

FIG. 12B shows two time-lines; the lower time-line 306 represents the execution order of the faster sample time blocks (Blocks A, E, and F), along with the rate transition blocks (Blocks B and D), while the top time-line 308 shows the execution order of the slower sample time block (Block C), and the rate transition (Block D) update method. The time-lines are generated from the sorted list 302 and the associated sample times 304. The lower line, representing the faster sample times has a TID of 0, and the top line has a TID of 1. For execution time T=0, the chart shows that the engine executes the output methods for Blocks F, E, D, A, and B (designated on the chart as $F_o$, $E_o$, $D_o$, $A_o$, $B_o$). Then, consistent with the flow chart for the multi-tasking mode (see FIG. 13 discussed below), the engine executes the update block methods for Blocks F and E (designated $F_u$, and $E_u$). Once the engine is finished with the high priority block methods, the output method for Block C ($C_o$) and the update method for rate transition block D ($D_u$) are executed. The execution time is then incremented by the step size (continue to assume 0.1 seconds) and the blocks that have a sample hit are executed. The figure shows execution of $F_o$, $E_o$, $A_o$, $F_u$, and $E_u$, which is repeated, as noted above, until execution time equals 1.0 second. Notice, like in the non-real-time case for Single-task mode, the engine does not wait for time to elapse; rather it executes block methods immediately upon completion of the previous pass through the loop.

FIG. 13 shows the overall sequence of steps taken by Simulink® in multitask mode. Following initialization (step 220), the output method execution list is executed for the fastest sample time (step 222). The update method execution list is then executed for the fastest sample time (step 224). A time time parameter is checked (step 225) to determine if the time is less than a designated stop time. If the stop time has been reached, the simulation completes (step 226). Otherwise, the integrate stage (step 228) is performed. The task ID variable is incremented (step 230) and compared to a parameter of the number of sample times (step 231). If the task ID is less than the number of sample times, the output method execution list for the methods assigned the new task Id are executed (step 232) followed by the execution of the update method execution list assigned the new task ID (step 234). The task ID variable is incremented and the process iterates with the task ID being compared to the number of sample rate times (step 231). When the task ID number is determined to equal the number of sample rate times, the simulation time is incremented (step 238) and the entire process iterates with the output method list execution list (step 222) being executed for the fastest sample times. The process continues until the end of simulation when the time equals the stop time (step 226).

In order to understand how the step size is picked within SimLoop, it is first necessary to understand the notion of a solver. The solver is a module of the execution engine that is responsible for performing two tasks: (a) determining how far execution time should be advanced between consecutive passes through the SimLoop in order to accurately trace the system's outputs, and (b) integrating the derivative of the states of the system to obtain the actual states. Based on how solvers perform the first task, they are generally classified into two basic classes: Fixed-step solvers or Variable-step solvers.

Fixed-step solvers are solvers in which the time step-size between consecutive passes through the SimLoop is a fixed quantity. The user generally explicitly specifies this quantity. These solvers are used to model types of systems that must operate within a defined time (discrete systems). For instance, an anti-lock braking system may be designed to control a car's braking system, and to execute such control in one-one hundredth (0.01) of a second so as to assure the car stops safely; if the braking system does not meet its timing constraints, the car may crash. Fixed-step solvers, therefore, are designed to help model discrete systems that have to generate a result in a fixed time period, and the fixed-step execution assures that the modeled system can generate such results.

Variable-step solvers are designed to model continuous systems where non-evenly spaced time steps are needed to simulate all significant behavior. For example, one may want to simulate the path of a bouncing ball, where it bounces, how high it bounces, and where it stops. It is known, based on experience, that the ball's bounces will not be evenly spaced, and that the height of the bounces will diminish as a result of gravity, friction, and other forces. Variable-step solvers are used for these types of continuous systems and to determine what step size to use so that the behavior of the ball will be accurately modeled.

The two broad classes of solvers are further subdivided based on the integration task they perform. There are several algorithms for carrying out numerical integration. The particular choice of the integration algorithm gives rise to the subclasses of solvers.

The difference in the conceptual definition of Fixed- and Variable-step solvers leads to the functional difference in the context of the SimLoop. The major difference between the solvers arises in the Integrate step of the SimLoop which is depicted in FIG. 14. During the Integrate step, the Variable-step solver executes the Output and Derivative block method lists for a number of iterations that varies based on the solver subclass (i.e., the numerical integration algorithm it uses) and integration error tolerances. In a fixed-step solver, the number of iterations is fixed for a given solver subclass. Another difference between solvers arises in the Integrate phase in the context of an operation known as zero-crossing detection. Zero-crossings in the derivatives of the state generally indicate a discontinuity in the states themselves. Because discontinuities often indicate a significant change in a dynamic system, it is important to trace the system outputs precisely at such points. Otherwise, the outputs of the model could lead to false conclusions about the behavior of the system under investigation. Consider, again the example of the bouncing ball. If the point at which the ball hits the floor occurs between simulation steps, the simulated ball appears to reverse position in midair. This might lead an investigator to false conclusions about the physics of the bouncing ball. To avoid such misleading conclusions, it is important that the execution has time steps on and around the vicinity of discontinuities.

In the case of Fixed-step solvers, there is no notion of zero-crossing detection and one is not guaranteed to find all points of discontinuity. One can only keep reducing the step-size to increase the probability of hitting the discontinuity. Contrastingly, in the case of Variable-step solvers, the Integrate step explicitly includes zero-crossing detection. The execution step size is then adjusted accordingly to ensure that discontinuities are tracked accurately. To enable zero-crossing detection, blocks that can produce discontinuities instantiate a special execution method. This method registers a set of zero-crossing variables with the execution engine, each of which is a function of a state variable that can have a discontinuity. The zero-crossing function passes through zero from a positive or negative value when the corresponding discontinuity occurs. During the zero-crossing detection phase of the Integration step, the engine asks each block that has registered zero-crossing variables to update the variables for the projected time of the next time step. These variables are then checked for a change of sign since the current step. Such a change indicates the presence of a discontinuity. An iterative process then tries to narrow down the location of the discontinuity and ensure that the next few time steps (at least 2) accurately bracket the location of the discontinuity. The final difference, which is in the step-size during execution, is a direct consequence of the two previous differences in the step-size determination. In Fixed-step solvers, the step size is a known and fixed quantity. For Variable-step solvers, the step size is determined during the integration iterations and the zero-crossing detection that happens during the Integration step.

An example of the variable-step solver is shown in FIG. 14, the derivative method execution list is executed (step 240) followed by the output method execution list (step 242). The derivative method execution list is then executed again (step 244) and the solver iterates between the execution of the output method execution list (step 242) and the execution of the derivative method execution list (step 244). A similar iteration loop then occurs between the execution of the output method execution list (step 246) and the execution of the zero-crossing method execution list (step 248). Note that Simulink® also includes other methods such as Projections and Jacobians in this step as needed.

While it is theoretically possible to have Variable-step solvers in the context of multitasking, such a combination is not employed in practice. This is because the step-size for such solvers can become very small making it impossible to keep up with the real-time constraint that generally goes along with multitasking execution. An added complication is that the integration step in such solvers is iterative and takes varying amounts of time at each step of the execution. Therefore, Variable-step solvers are generally used only in conjunction with the Single-Tasking SimLoop. Additionally, they are not usually employed in systems that need to operate in real-time.

When a model contains an algebraic loop, the engine calls a loop solving routine at each time step. The loop solver performs iterations and perturbations to determine the solution to the algebraic condition (if it can). One possible approach to solving the algebraic equation $F(z)=0$, is to use Newton's method with weak line search and rank-one updates to a Jacobian matrix of partial derivatives. Although the method is robust, it is possible to create loops for which the loop solver will not converge without a good initial guess for the algebraic states z. Special blocks are generally provided to specify an initial guess of the states in the algebraic loop.

In addition to the various forms of the SimLoop, modeling packages such as Simulink® use the output of the Link stage to compute linear models through a process generally referred to as model linearization. These linear models may be used in the SimLoop at various points in the execution of the overall model. Alternatively, the linear model may be returned to the user. The linearization process involves the use of a Jacobian method defined on blocks and numerical Jacobian algorithm.

Information related to the compiled block diagram may be presented to users in an automatically generated report. This report allows users to quickly obtain documentation of the functional description of their model. Information related to the execution of a particular model (such at the time taken to execute various portions of the model and the coverage of various portions of the model) may be obtained automatically and presented to the user as a report.

Generally, graphical analysis and simulation methods, such as the block diagram method, are used in modeling for design, analysis, and synthesis of engineered systems. The visual representation allows for a convenient interpretation of model components and structure and provides a quick intuitive notion of system behavior.

Conventional simulation models become more complex as models are developed that model more complex systems. Hundreds of thousands of blocks that represent primitive and aggregate mathematical operations may be present. To manage the complexity of such models, principles of partitioning, abstraction, and hierarchy are applied. Hierarchy in graphical models is typically captured by subsystems. The subsystems are modeled by primitive blocks and/or additional subsystems. Because subsystems may contain subsystems, a mechanism exists for hierarchically structuring a model.

Abstraction allows dismissing system behavior in the model if it is not of importance to the problem that needs to be addressed and for which the model is designed. In fact, including arbitrary detail often complicates and slows the design, analysis, and/or synthesis tasks.

The concept of partitioning is utilized to create more or less separate and independent modules (or "units") within the model. Partitioning facilitates teams of engineers to work on engineering projects where each engineer or group of engineers is responsible for one unit of the overall model. This paradigm is a necessity given that the overall system development task has reached a level of complexity that is beyond the cognizance of any one single individual.

To facilitate a group effort, the partitions that are the responsibility of separate teams of engineers are stored as independent units. Engineering teams that are not working on a particular unit (i.e., those teams working on different units) become customers of the units they are not developing and must rely on use of references to those units from their own units. In this manner, there is one truth unit that is maintained by the responsible team and whenever this subsystem is changed, the reference to it can be updated to the most recent version. In other words, there is only one version of each unit that is the true and updated version. This is controlled by the particular team that is developing the unit. However, all other teams that are effectively customers of that unit automatically receive the most up to date version because they reference the unit, rather than having to periodically obtain an updated copy of the unit. In this manner, the most current version of all units can be accessed by references to those units, at any time.

For example, consider the control system of a power window system as found in modern automobiles. Such a system may consist of a discrete event controller that makes the window move up when the driver presses the up button, and down when the driver presses the down button. The event controller could further account for the precedence that a driver command has over a passenger command, and the like. Typically, a dedicated design team will be responsible for the unit controlling precedence.

In addition, there is a data validation functionality. The discrete event controller may be designed based on the assumption that the driver commands can be either "up", "down", or "neutral", but in an actual implementation there may be no guarantee that these commands are mutually exclusive when provided to the discrete event controller. This is addressed by the implementation of data validation functionality that processes the driver commands and ensures mutual exclusivity. The data validation functionality contains logic to decide what command to relay to the discrete event controller in case, for example, both the "up" command and the "down" command are given at the same time (typically either "down" or "neutral" is chosen for safety reasons).

FIG. 15 shows the power window controller with the discrete event controller in the control block having two data validation blocks: one for the driver commands, validate_driver, and one for the passenger commands, validate_passenger. In general, there may be more such modules as there are controls for the backseat passengers as well. These blocks are the responsibility of a team different from the team responsible for the control block in FIG. 15. Therefore, it is desirable to include a reference to the actual implementation of the data validation blocks so they can be developed independently.

An important characteristic of references is that the same unit can be referenced from multiple locations in a model. To illustrate, consider the data validation blocks in FIG. 15. The functionality embodied by both a driver commands validation 600 and a passenger commands validation 602 is identical. Therefore, instead of two distinct references for both of these subsystems, one unit model can be created and referenced from both the driver commands validation and the passenger commands validation subsystems. This greatly improves maintainability of the model as the effort to keep duplicate functionality synchronized and up-to-date is avoided.

Sophisticated modeling tools, such as Simulink®, provide flexibility in reducing model pattern duplication by supporting a form of "polymorphism" for block diagrams so that two patterns do not have to be identical but instead a certain similarity suffices. The property differences that are allowed (e.g., data types, sample times, signal dimensions) can be automatically resolved by Simulink® based on the context in which the block is used (i.e., the blocks that are connected to the block). All that is required is to mark the particular properties to be inherited.

For example, consider the model in FIG. 16. Here two branches that are similar connect to the Sum block. The Gain→Unit Delay and Gain1→Unit Delay1 patterns are similar, and therefore, they can be replaced by instances of one library block, as shown in FIG. 17, because of the polymorphism that adopts the incoming data type (either single or double, depending on whether computed by the Product or Product1 block, respectively) of the library block and modifies the functionality accordingly. The Product and Product1 blocks are different in the data types they produce, and so cannot be included in the single library block.

The use of references in graphical models has proven to be an intuitive and convenient mechanism to organize the overall modeling effort and to streamline and make the coordination between engineering teams very efficient. However, state-of-the-art tools require this partitioning to be a manual process. As such, the process for seeking out opportunities for replacing subsystems with references suffers from the well-known drawbacks of manual implementations, including human error, incomplete analysis, and inability of a user to grasp the full complexity of a highly complex system model.

For example, it is common to overlook optimization in terms of creating additional references but also, organizing references differently may lead to improved models in terms of partitioning. In general, there is the trade-off between few large partitions or many small partitions. The process for selecting the size of each partition is difficult in general. This is illustrated by the power window controller in FIG. 15. The common functionality of the validate_driver 600 and validate_Passenger 602 blocks is shown in FIG. 18. This functionality contains two blocks, check_up 604 and check_down 606, that have the same functionality again. In this model, it was manually chosen to have four references to this checking functionality, i.e., two for both the validate_driver 600 and the validate_passenger 602 block of FIG. 15. Instead, however, the functionality of each of the two blocks in the validation blocks could have manually been put into one reference 608, as illustrated in FIG. 19.

The need for automatically replacing common patterns by references is amplified when automatic model generation is applied. For example, to study the comfort of the driver in a truck cabin, models of the damping of the tires, shocks, seat, and other elements of the hardware can be used to produce the frequency response diagram. As high frequencies do not contribute to the sense of comfort, the phenomena that constitute these should not be present in the model. Automatic order selection tools may generate models for each of the elements of an order that results in behaviors pertinent to the frequency range of interest. This, however, may result in a large number of repeated patterns that is very similar to the potential copy/paste use of model designers. In order to make the model readable but also easier to maintain and less demanding in terms of storage it is desirable to find common patterns and replace these by references to unique units.

In addition, there is a need in the overall system design process to progressively "lock down" more properties of subsystems. This requires reducing the degree of polymorphism to the point where the interface of a subsystem is completely fixed and it can be tested as a separate and individual unit. No changes to its behavior will result from using it in a particular context. Automated support for this is essential especially since reducing the degree of polymorphism may require generating multiple units for the instances of the original set of references.

This notion can be illustrated by referring to FIG. 17, interpreting it as the design for an embedded controller. In the early design stages the data type polymorphism can be conveniently exploited. However, when the design moves toward an implementation, the automatically synthesized code may be devoid of such polymorph properties, and therefore, the actual implementation may require fixed data types. To ensure the implementation and the simulation produce the same behavior, the data type also needs to be fixed in the model. At such time, one referenced unit does not suffice anymore.

Apart from the reduced effort that is required by the user because of automation, the rigor of automation will also rule out incompleteness and help optimizing the model partitioning that was generated by the original model designers. In particular, if sophisticated algorithms of a scaleable complexity are designed (e.g., linear or quadratic) then automated methods may perform better than a manual approach, because humans do not scale well, even for algorithms with low order of complexity.

SUMMARY OF THE INVENTION

There is a need for an automated method for identifying one or more components within a model according to selected characteristics and/or a pattern of similarities to references. The present invention is directed toward further solutions to address this need.

In accordance with one embodiment of the present invention, in an electronic device, a method of altering a graphical model includes identifying a component of the graphical model for conversion. The component is processed to identify one of similarities with other components and similarities with selected characteristics. The component is automatically converted into a reference.

In accordance with aspects of the present invention, the component includes at least one of a system, a sub-system, a portion of a system, and a portion of a sub-system disposed within the graphical model. The graphical model includes a plurality of components.

In accordance with further aspects of the present invention, the step of identifying the component can include heuristically locating a re-usable pattern and selecting the component to represent the re-usable pattern. The step of identifying the component can include utilizing a checksum to identify a selected pattern and selecting the component that matches the selected pattern. The step of identifying the component can include heuristically locating a specific type of component and selecting the component that matches the specific type. The step of identifying the component can include locating a selected acyclic graph of blocks and selecting the component that contains the selected acyclic graph of blocks. The step of identifying the component can include utilizing a partitioning specific checksum to select a predetermined combination of selected patterns and selected re-usable features of the component for identification. The step of identifying the component can include soliciting user interaction to participate in a selection of the component based on at least one of pattern matching, re-usability, and polymorphism characteristics.

In accordance with further aspects of the present invention, the step of automatically converting the component into a reference can include creating a new model and copying the component into the new model. Compiled properties to be fixed can be set into input and output ports. The step of automatically converting the component into a reference further can include copying a configuration set from the component into the new model. The configuration set can include model peripheral information. The other components can be replaced with references to the new model.

In accordance with further aspects of the present invention, the step of automatically converting the component into a reference can include collapsing the component into a subsystem within the graphical model. The step of automatically converting the component into a reference can include copying the subsystem into a library, forming a library subsystem and leaving an original version of the subsystem within the graphical model. The step of automatically converting the component into a reference can include replacing the original version of the subsystem with a reference to the library subsystem.

In accordance with further aspects of the present invention, the other components can be replaced with references to the library subsystem. The reference can include one of a library reference and a model reference.

In accordance with further embodiments of the present invention, a system for altering a graphical model includes an identifier for identifying a component of the graphical model for conversion. A converter is provided for processing the component to identify one of similarities with other components and similarities with selected characteristics, and automatically converting the component into a reference.

In accordance with further aspects of the present invention, the component includes at least one of a system, a sub-system, a portion of a system, and a portion of a sub-system disposed within the graphical model. The graphical model includes a plurality of components. Identifying the component includes heuristically locating a re-usable pattern and selecting the component to represent the re-usable pattern. The identifier utilizes a checksum to identify selected patterns selecting the component that matches the selected patterns. The identifier heuristically locates a specific type of component and selects the component that matches the specific type. The identifier locates a selected acyclic graph of blocks and selects the component that contains the selected acyclic graph of blocks. The identifier utilizes a partitioning specific checksum to select a predetermined combination of selected patterns and selected re-usable features of components for identification. The identifier solicits user interaction to participate in a selection of components based on at least one of pattern matching, re-usability, and polymorphism characteristics.

In accordance with further aspects of the present invention, the converter creates a new model and copies the component into the new model. The converter sets compiled properties to be fixed into input and output ports. The converter copies a configuration set from the component into the new model. The configuration set includes model peripheral information. The converter replaces the other components with references to the new model. The converter collapses the component into a subsystem within the graphical model. The converter copies the subsystem into a library, forming a library subsystem and leaving an original version of the subsystem within the graphical model. The converter replaces the original version of the subsystem with a reference to the library subsystem. The converter replaces the other components with references to the library subsystem. The reference can include one of a library reference and a model reference.

In accordance with another embodiment of the present invention, a medium holding computer executable steps for carrying out a method of altering a graphical model is provided. The method includes identifying a component of the graphical model for conversion. The component is processed to identify one of similarities with other components and similarities with selected characteristics, and automatically convert the component into a reference.

In accordance with another embodiment of the present invention, a method of simplifying a model includes providing a plurality of components forming the model. Repeating occurrences of a pattern are identified among the plurality of components. A new model is created based on the pattern. Each of the repeating occurrences of the pattern is replaced with a reference to the new model.

BRIEF DESCRIPTION OF THE DRAWINGS

The present invention will become better understood with reference to the following description and accompanying drawings, wherein.

DETAILED DESCRIPTION

Figure 1A:
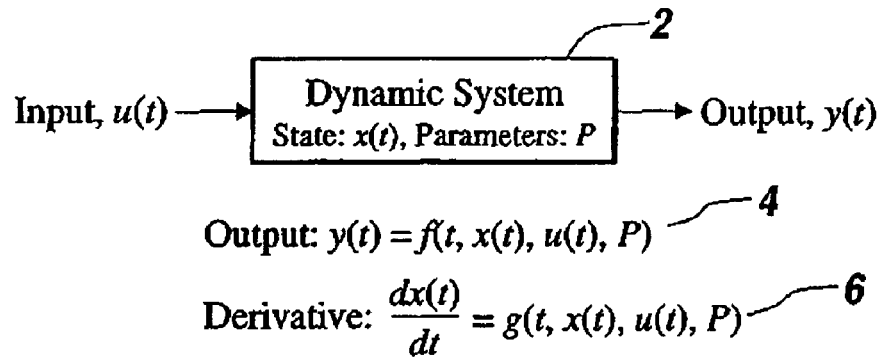
FIG. 1A depicts a conventional dynamic system described with ordinary differential equations (ODE)
Figure 1B:
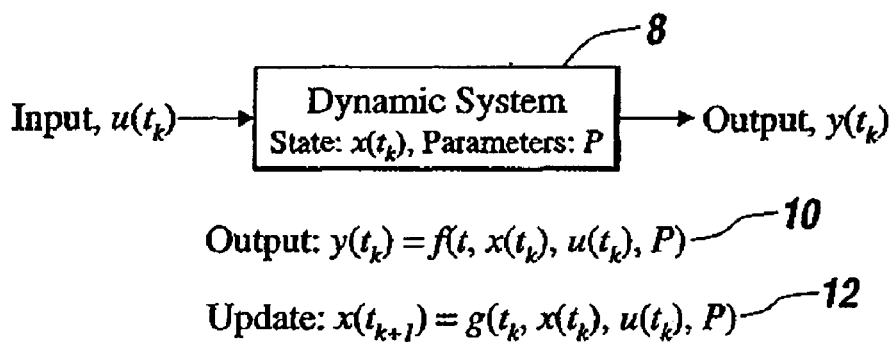
FIG. 1B depicts a conventional dynamic system described with difference equations.
Figure 1C:
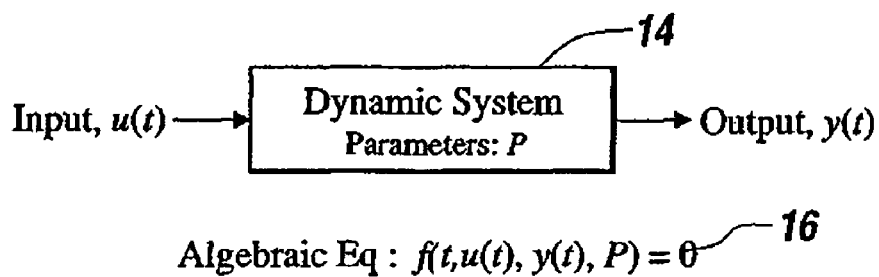
FIG. 1C depicts a conventional dynamic system described with algebraic equations.
Figure 2:
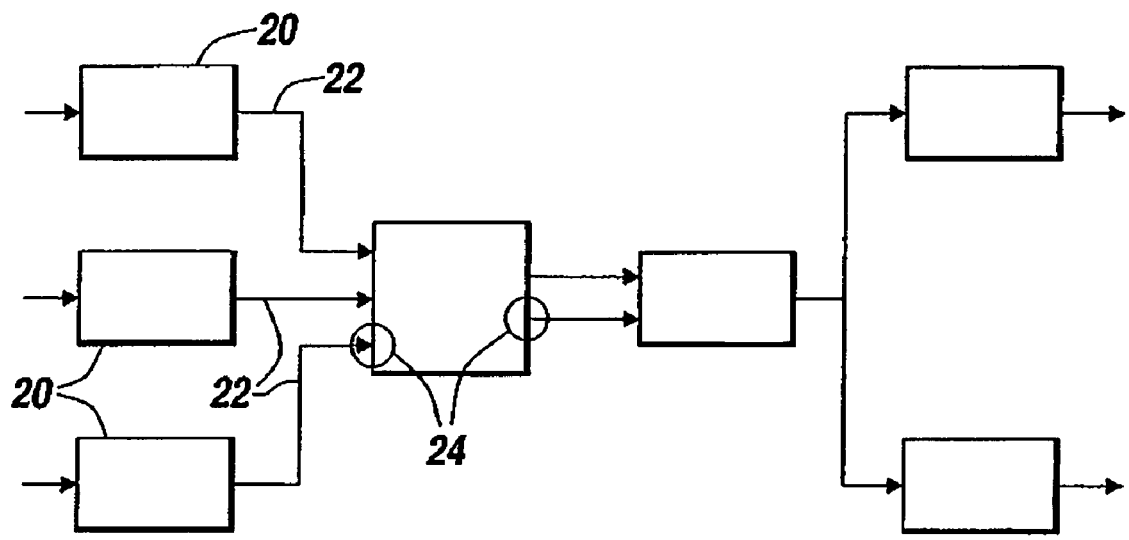
FIG. 2 depicts conventional components of a basic block diagram.
Figure 3:
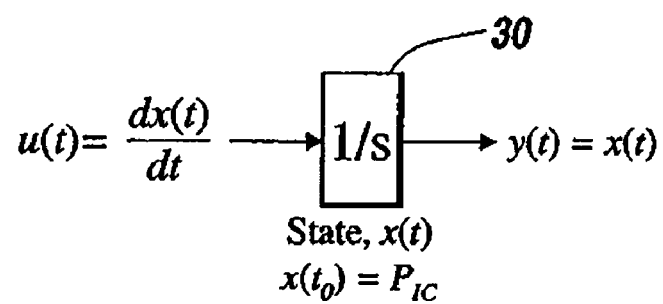
FIG. 3 depicts the desired behavior of a conventional integrator block.
Figure 4:
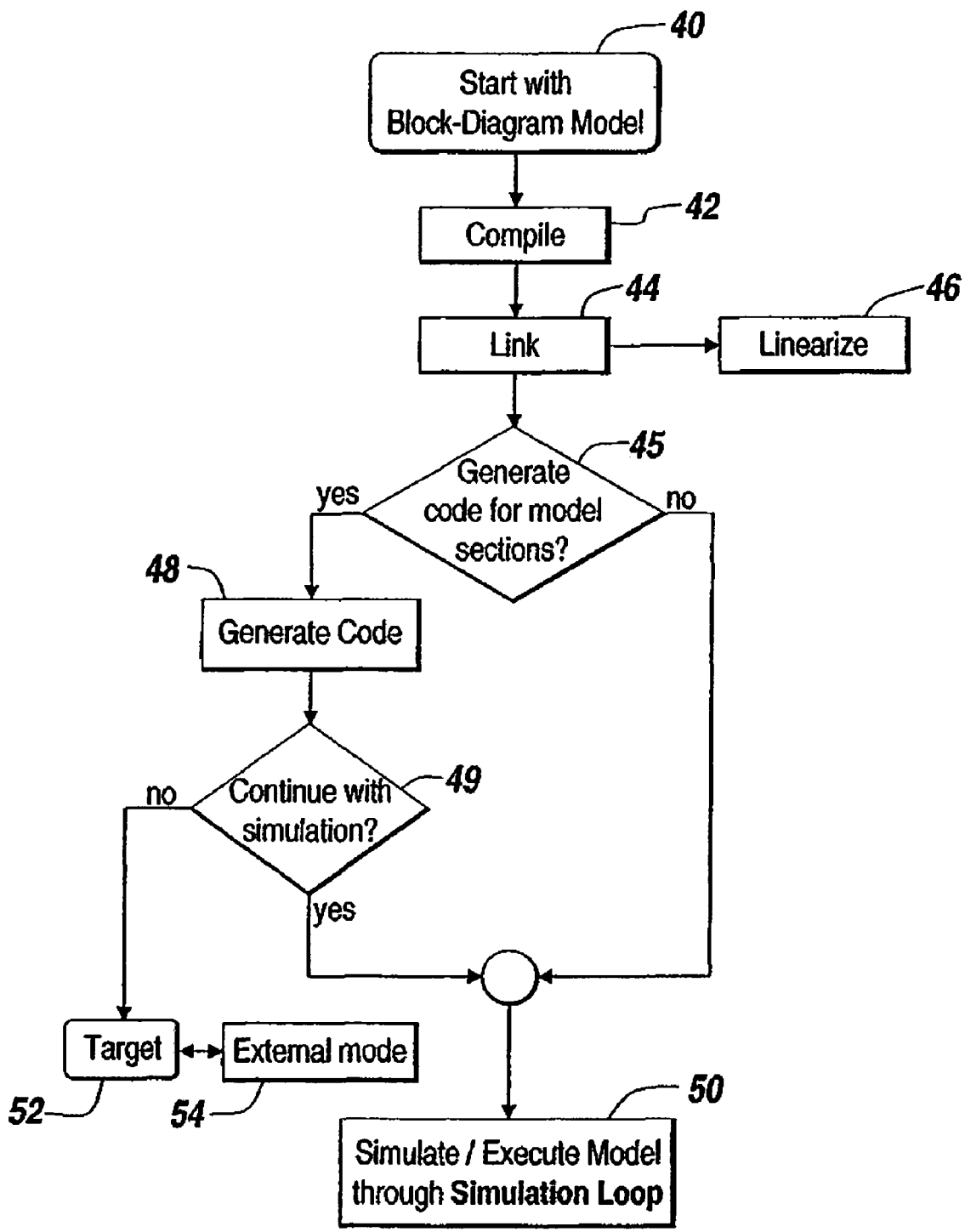
FIG. 4 is a flow chart of the sequence of steps used to perform conventional simulation of the block diagram.
Figure 5:
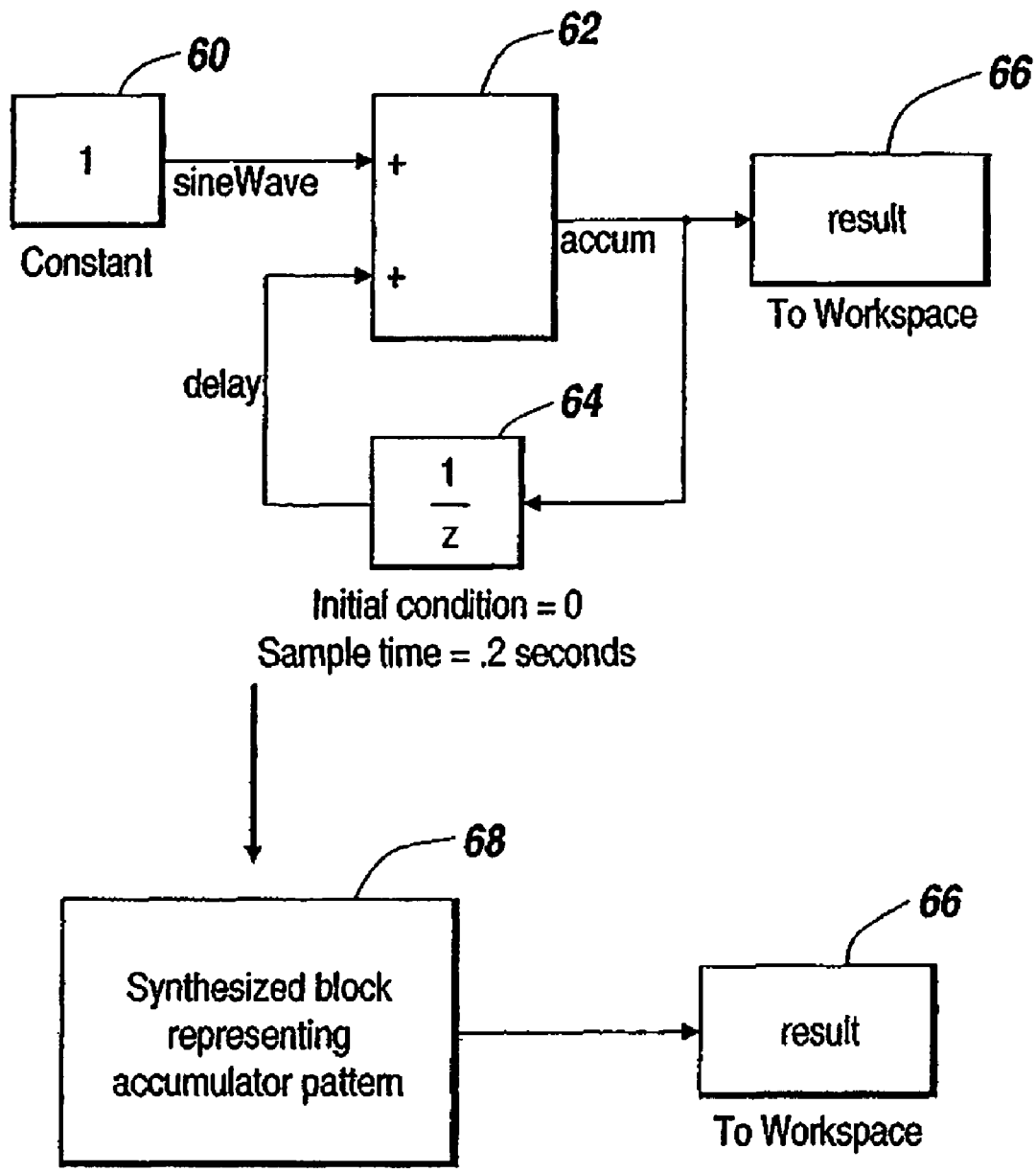
FIG. 5 depicts the conventional replacement of a collection of blocks in a block diagram with an accumulator block.
Figure 6A:
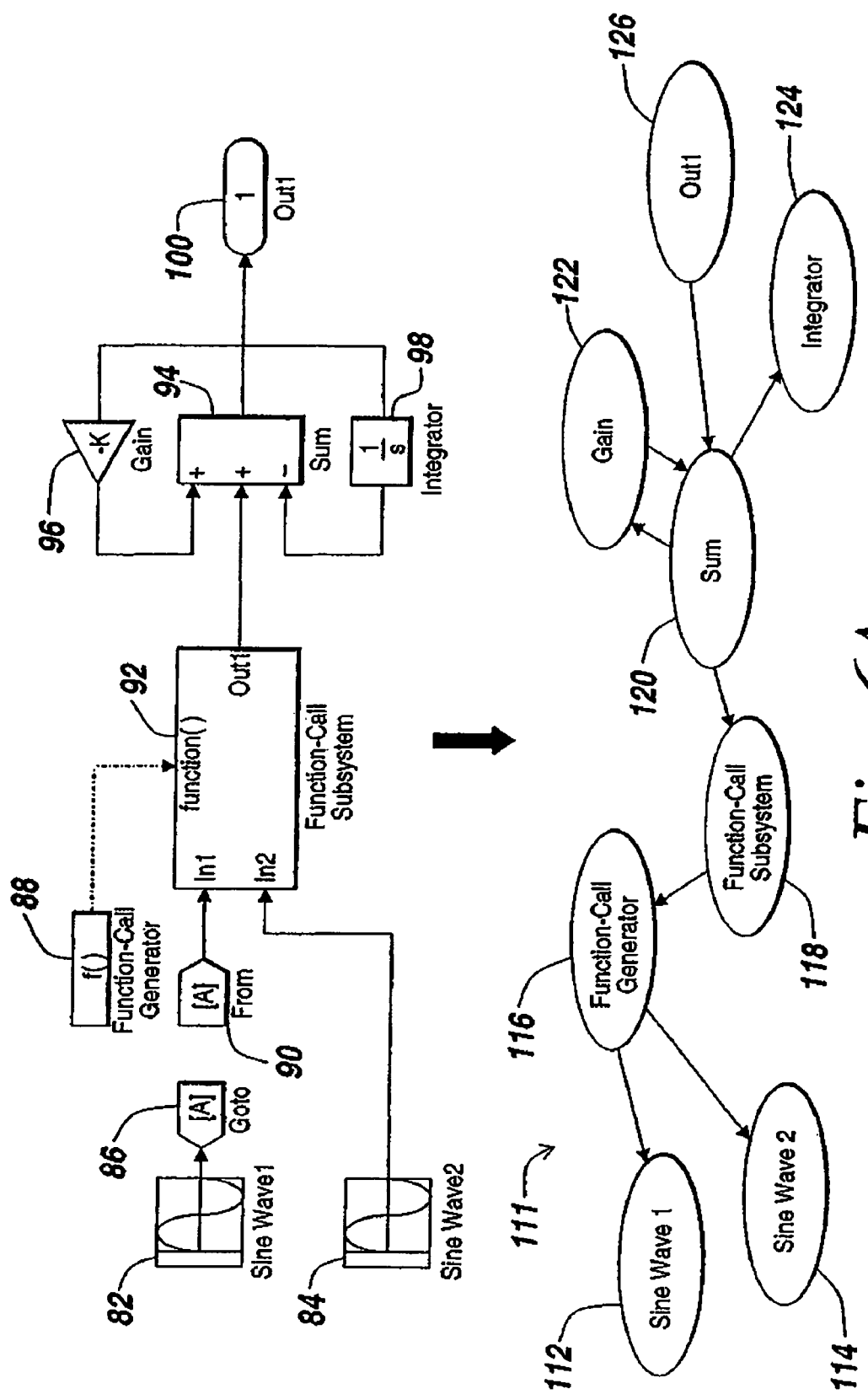
FIG. 6A depicts a conventional block diagram and its associated directed graph.
Figure 6B:
FIG. 6B depicts a conventional linear sorted list generated from the directed graph of FIG. 6A.
Figure 7A:
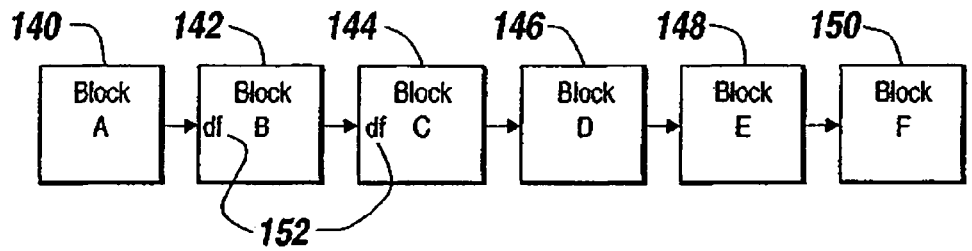
FIG. 7A depicts an abstract example of a conventional block diagram being executed.
Figure 7B:
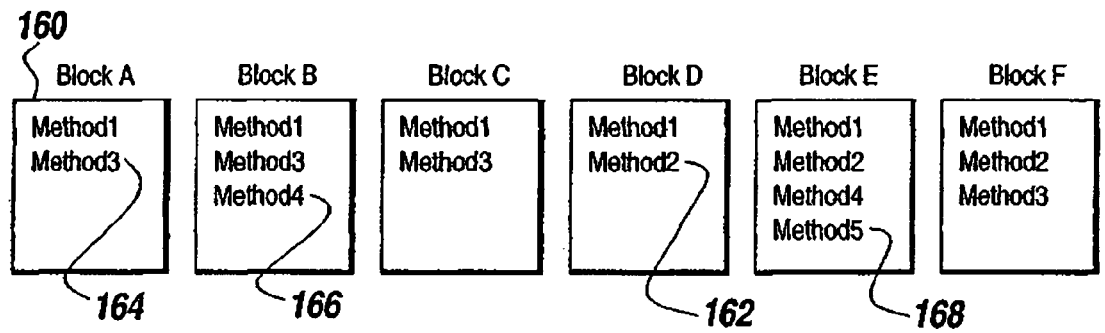
FIG. 7B depicts an abstract view of the conventional execution methods instantiated by the blocks depicted in FIG. 7A.
Figure 7C:
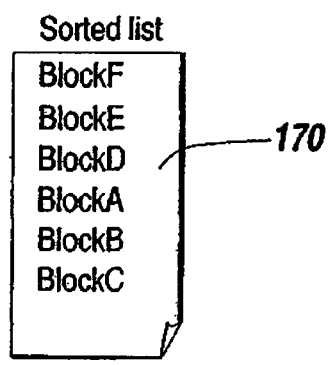
FIG. 7C depicts a conventional sorted list generated from the data dependencies between blocks of FIG. 7A.
Figure 8:
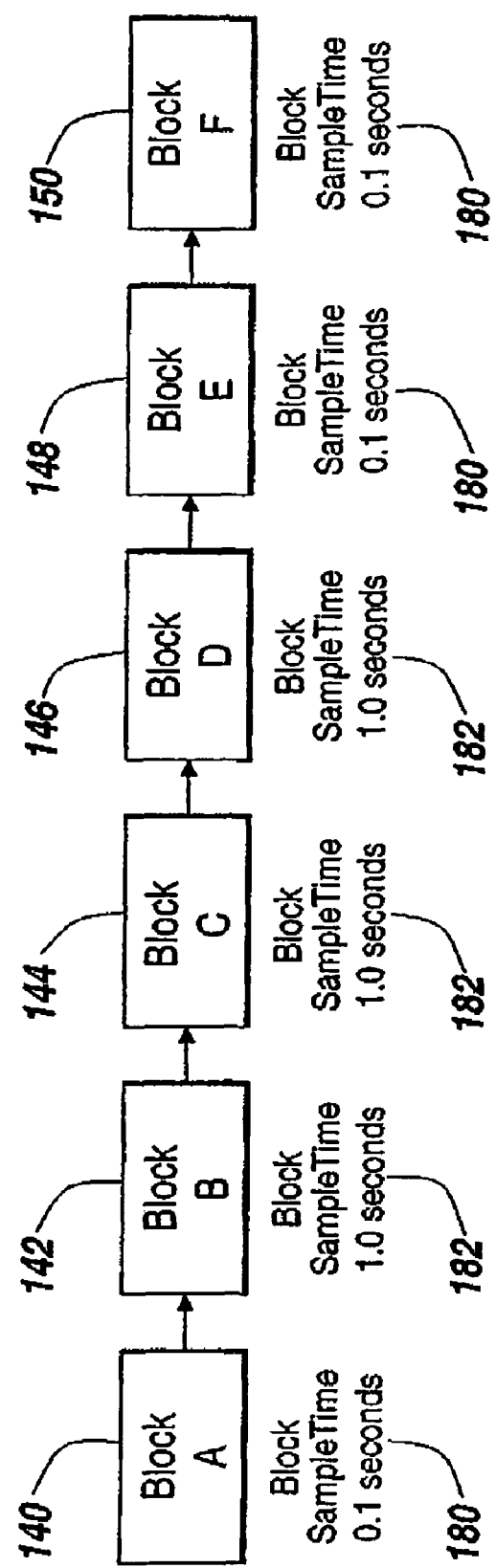
FIG. 8 depicts a conventional multi-rate system.
Figure 9:
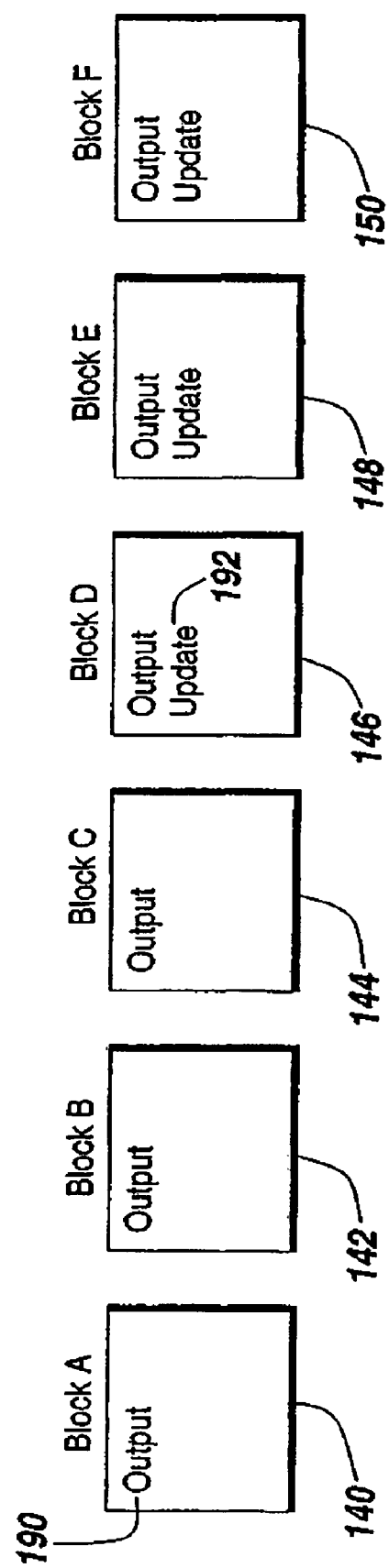
FIG. 9 depicts the block diagram of FIG. 7A and FIG. 8 with associated conventional methods added to the blocks.
Figure 10:
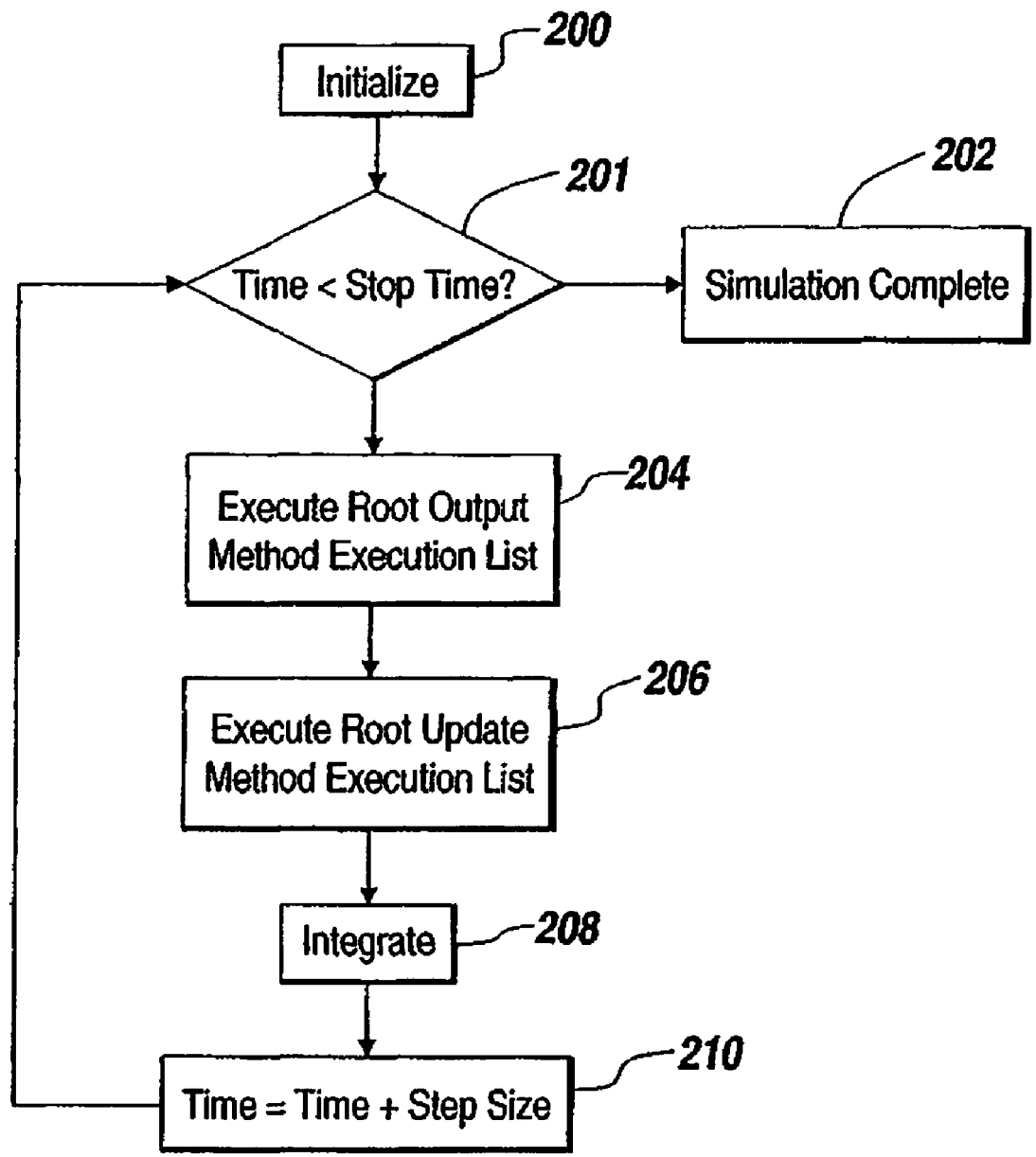
FIG. 10 is a flowchart of the conventional sequence of steps followed by a single-tasking execution loop.
Figure 11A:
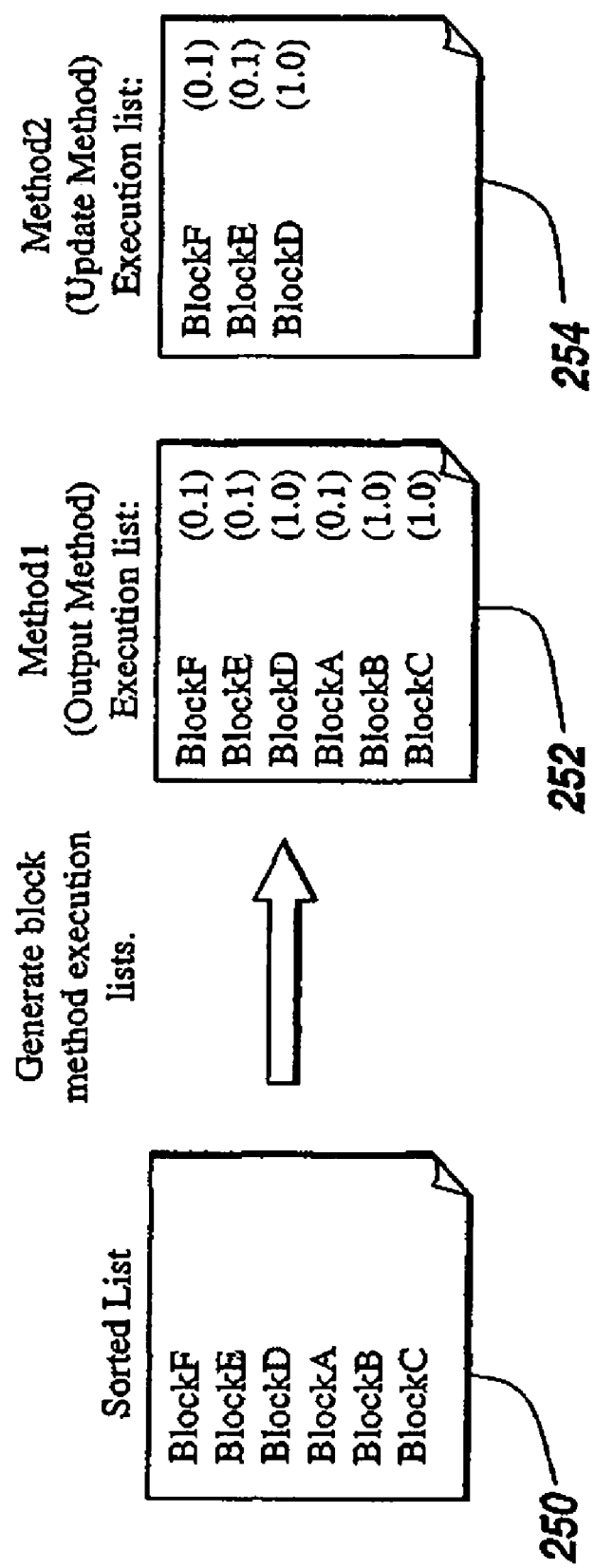
FIG. 11A depicts the conventional creation of execution lists from sorted lists in single task mode.
Figure 11B:
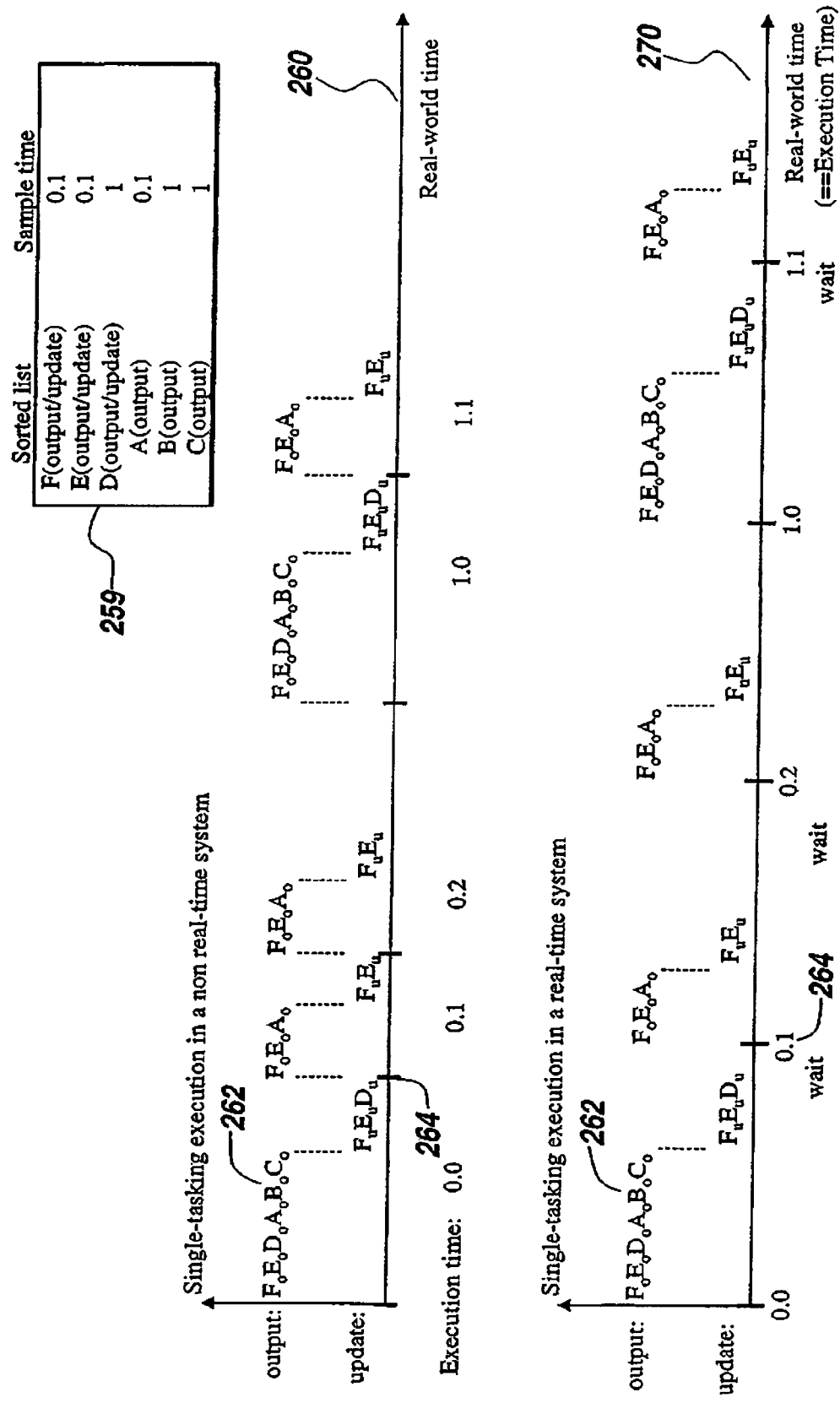
FIG. 11B depicts the conventional execution timing of block diagrams in single task mode in timelines synchronized and non-synchronized with real world time.
Figure 12A:
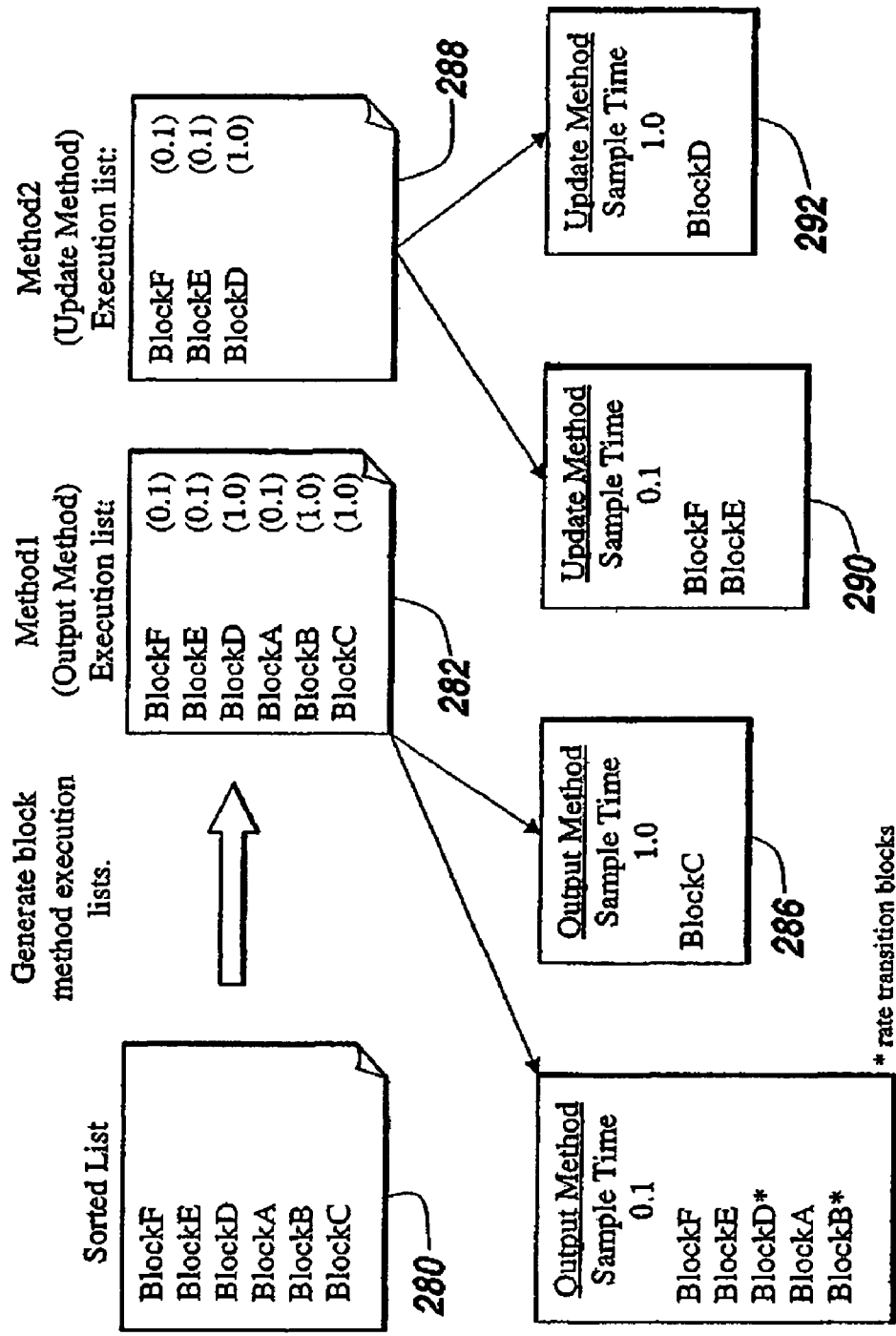
FIG. 12A depicts the conventional creation of execution lists from sorted lists in multi-task mode.
Figure 12B:
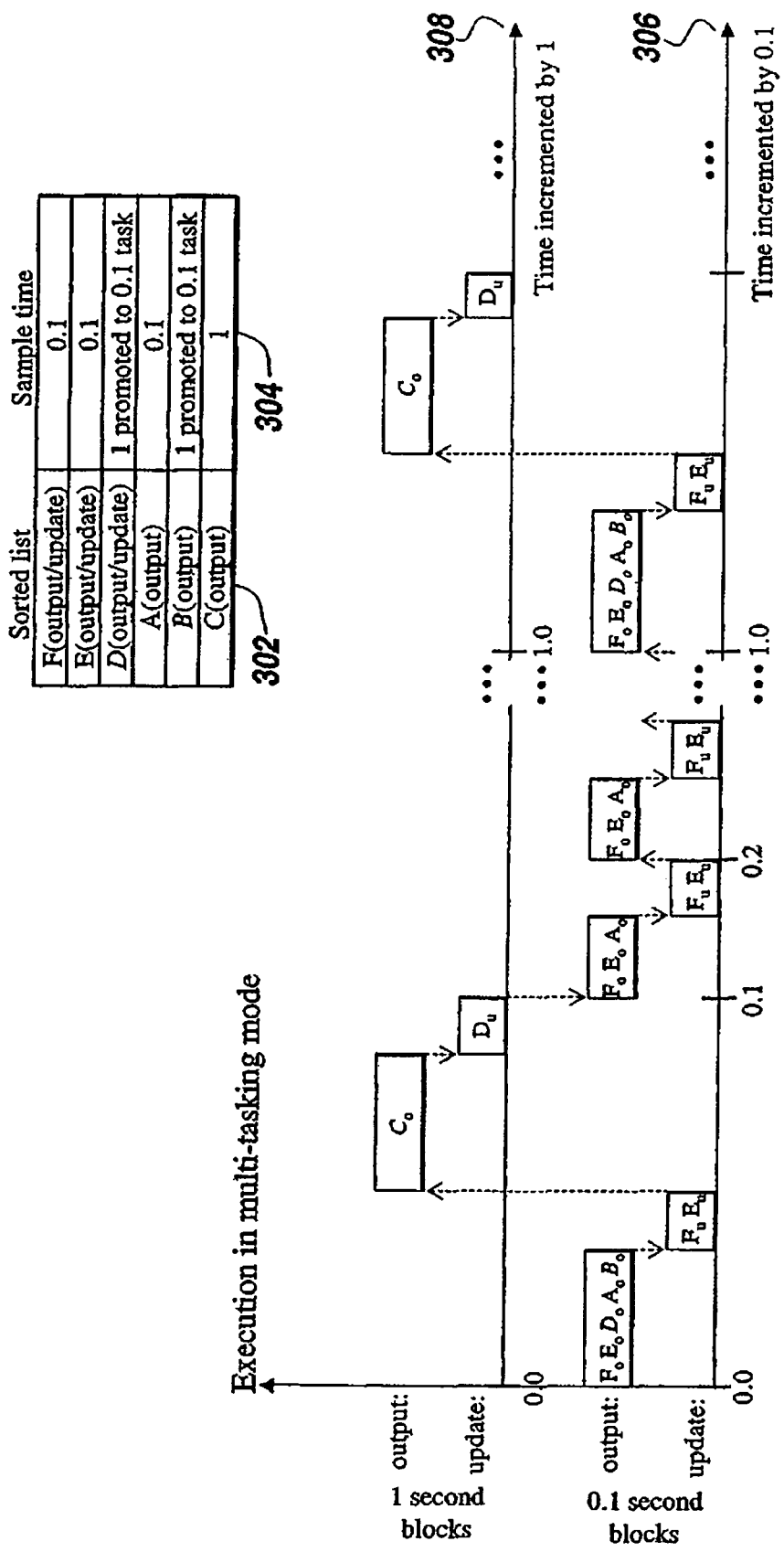
FIG. 12B depicts the conventional execution timing of block diagrams in multi-task mode.
Figure 13:
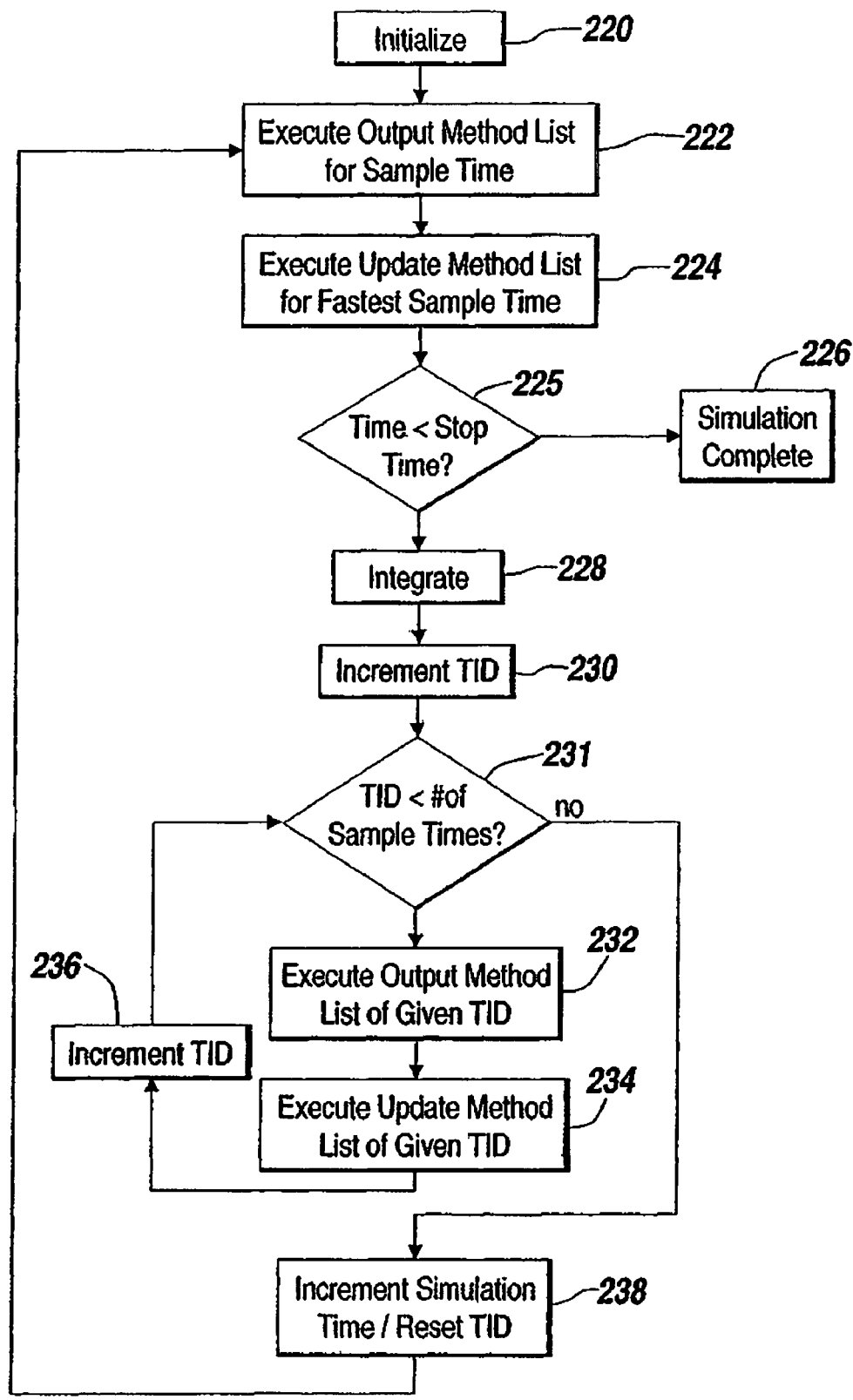
FIG. 13 is a flowchart of the conventional overall sequence of steps taken by Simulink® in multi-task mode.
Figure 14:
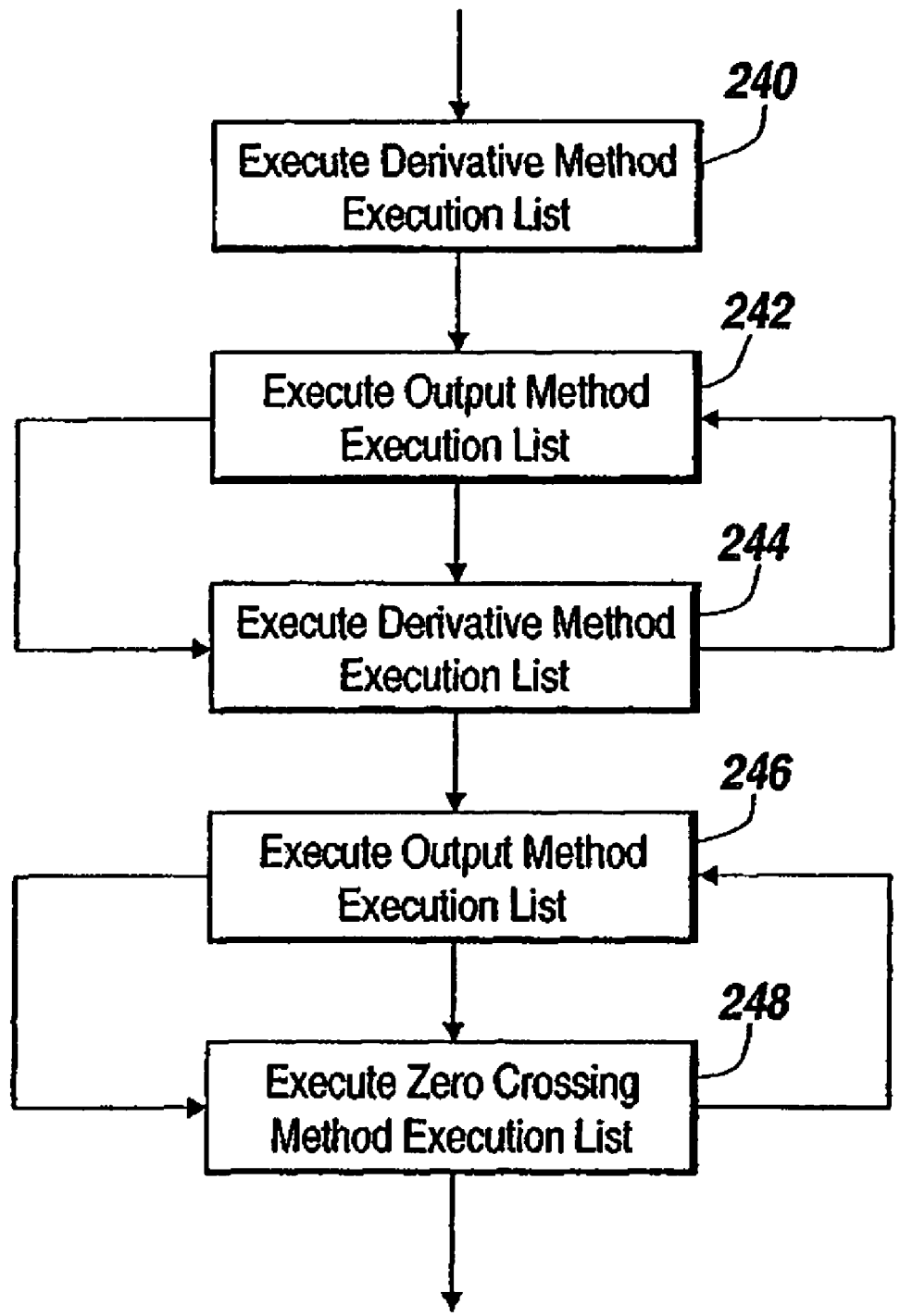
FIG. 14 is a flowchart of the conventional sequence of steps followed by a variable-step solver.
Figure 15:
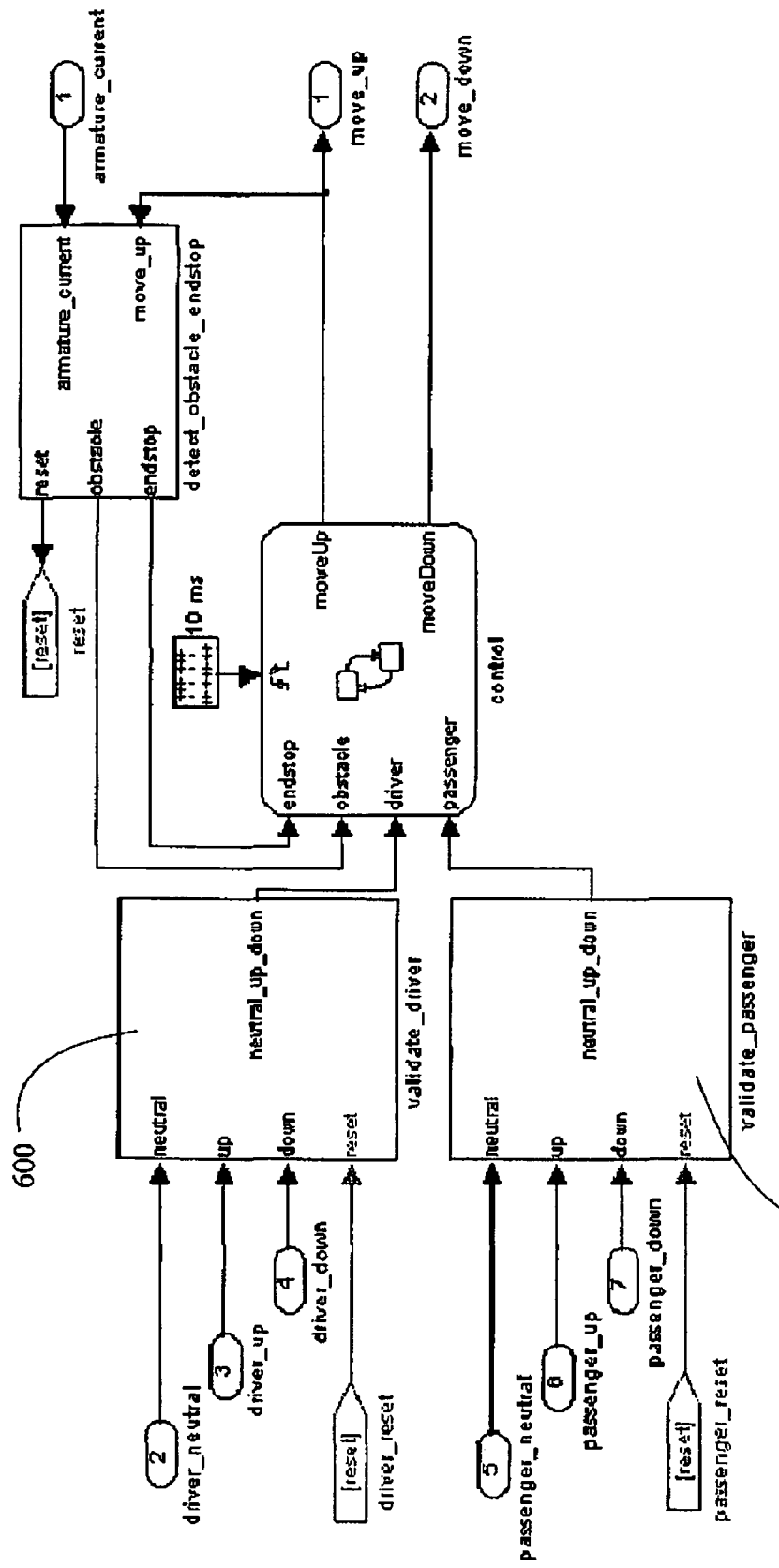
FIG. 15 is a diagrammatic illustration of an example conventional event controller.
Figure 16:
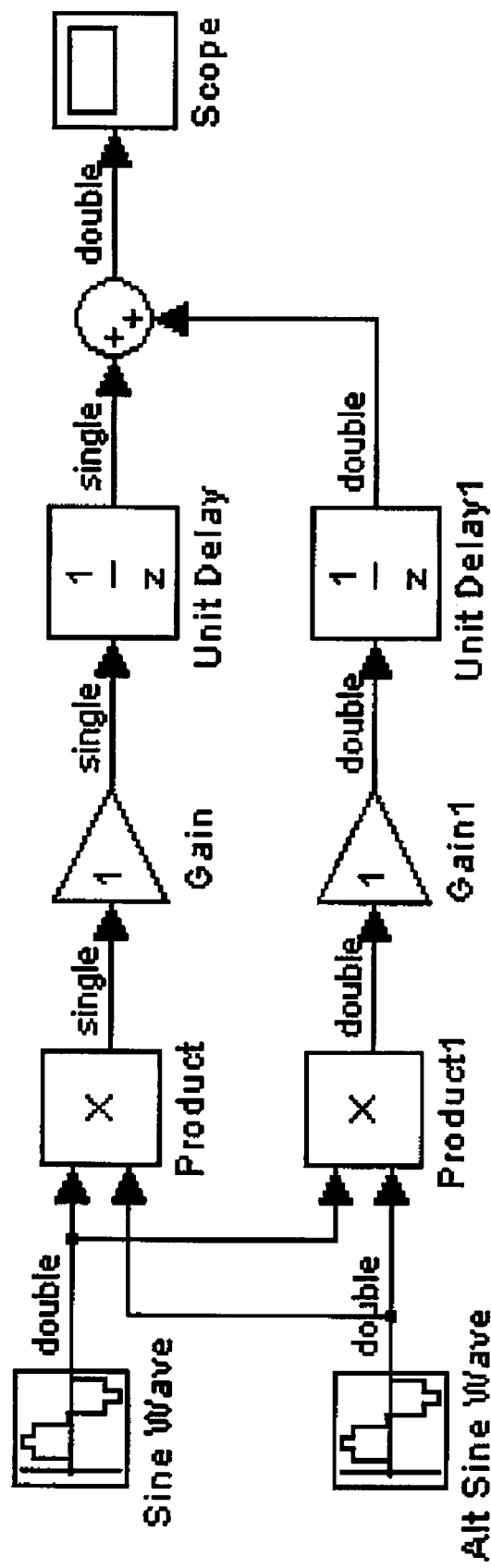
FIG. 16 is a diagrammatic illustration of an example conventional model.
Figure 17:
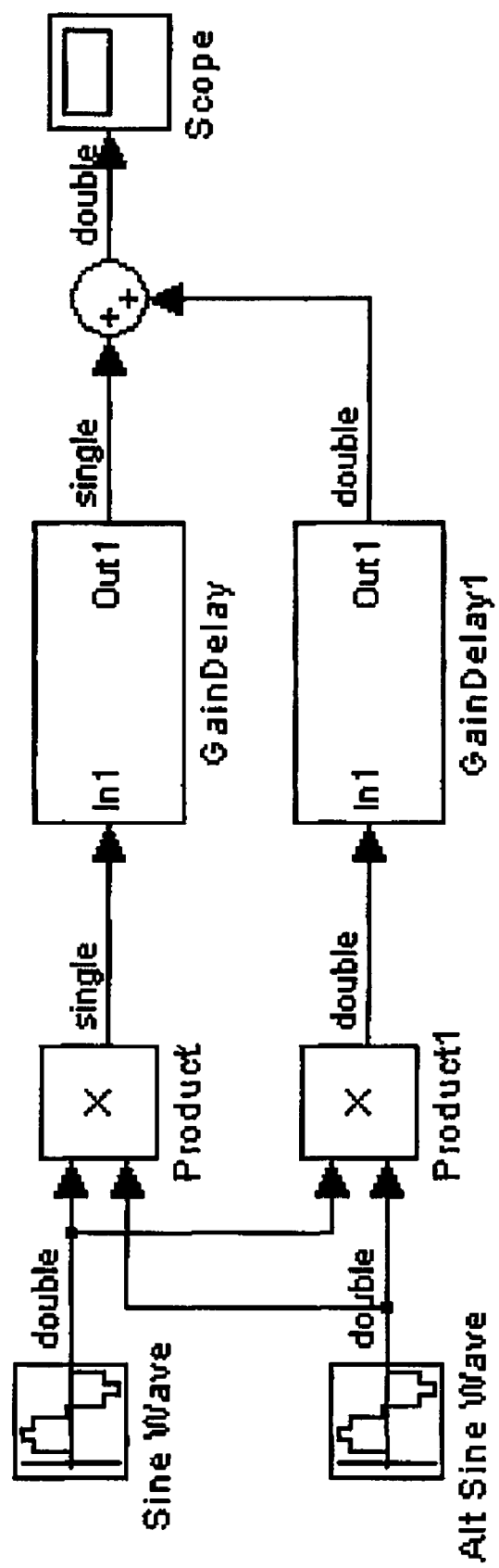
FIG. 17 is a diagrammatic illustration of a conventional partially reduced version of the model of FIG. 16.
Figure 18:
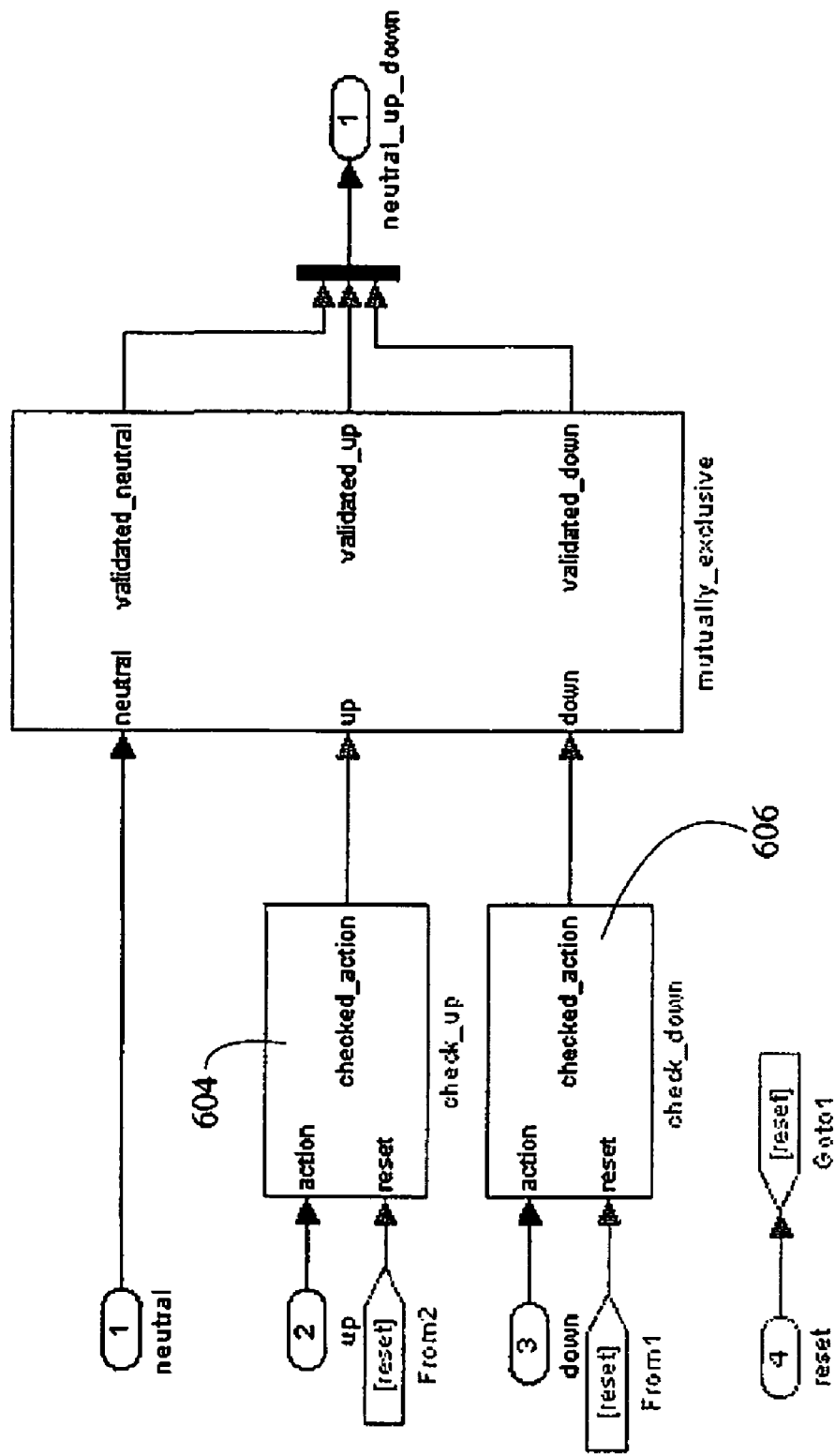
FIG. 18 is a diagrammatic illustration of a conventional partially reduced version of the model of FIG. 15.
Figure 19:
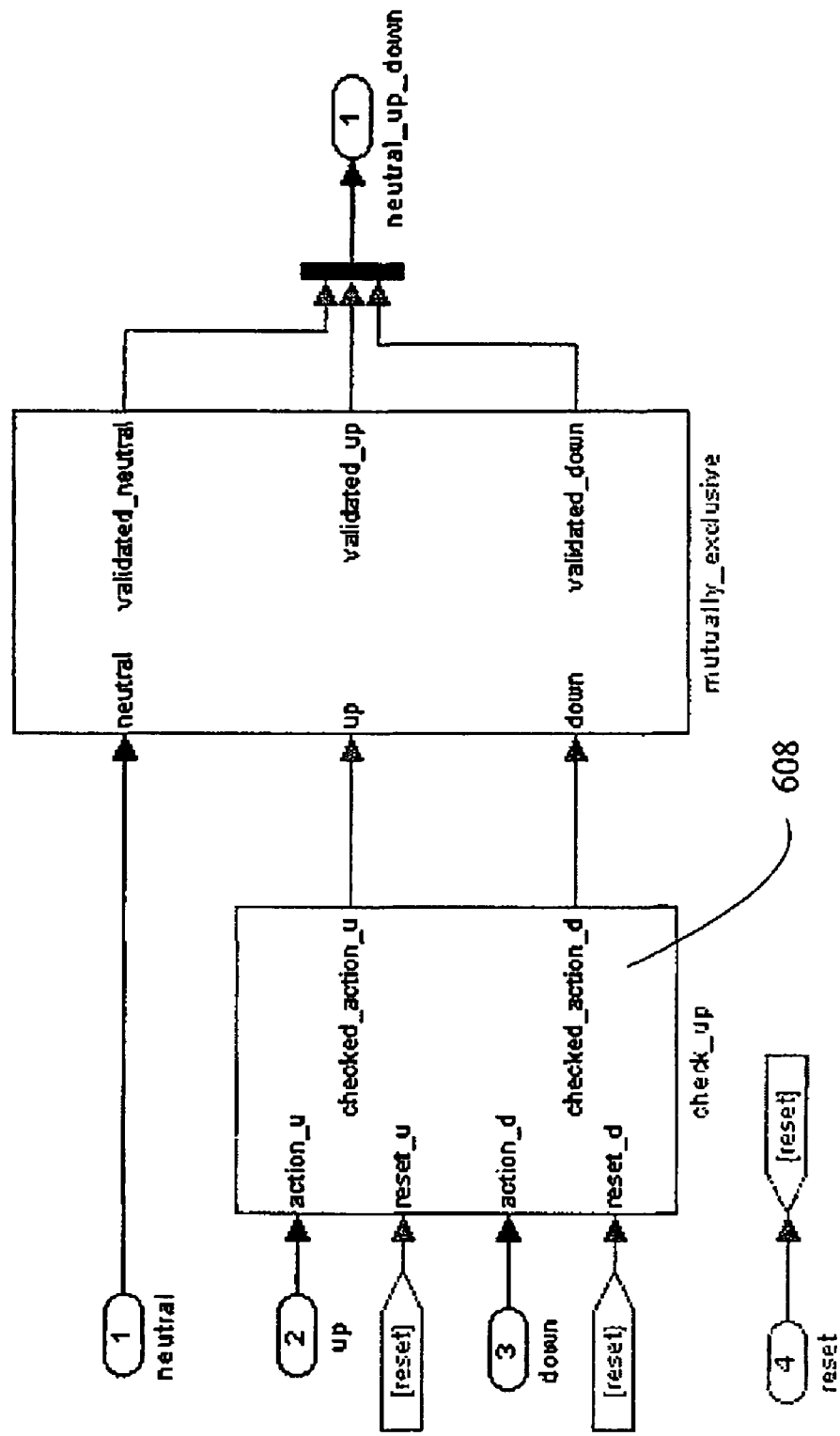
FIG. 19 is a diagrammatic illustration of a conventional further reduced version of the model of FIG. 15.

An illustrative embodiment of the present invention relates to an automated model simplification feature that systematically converts duplicate or otherwise selected patterns in a model into references. The invention enables the use of multiple references to one unit that contains the otherwise duplicated, or selected, functionality. Duplicated functionality is identified based on a number of arguments that may be user supplied. These arguments include the level of polymorphism (e.g., which of the sample times, dimensions, and data types can be propagated in) but also the maximum size of the patterns to look for to address the general trade-off of generating few partitions with many blocks or many partitions with few blocks and which modeling constructs are used (e.g., whether Go To/From connections such as in Simulink® are present). The present invention also facilitates converting the model into potentially disjoint partitions. When changes to the model are made, these changes propagate only to affected partitions and the remaining part of the model does not have to be processed again (e.g., by propagating signal dimensions) which can lead to decreased model processing times.

FIGS. 20 through 26, wherein like parts are designated by like reference numerals throughout, illustrate example embodiment of a system and method for automatically partitioning a graphical model into a hierarchy of models according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed, such as variations in the elements or implementations in a manner still in keeping with the spirit and scope of the present invention. Furthermore, the present invention anticipates use with a variety of different modeling applications, including all of the different classes of graphical models as described herein and otherwise known to those of ordinary skill in the art. As such, although the language of the present description makes use of block diagrams and blocks to describe the use of the present invention, there is no intention to limit the present invention to use only with block diagram modeling applications.

It should be noted that in the example modeling application Simulink® that is utilized in the following description for illustrative purposes, and also in other modeling applications, there can be two types of references identified: (i) indirect references and (ii) direct references. An indirect reference (for example, a "library block" in Simulink®) refers to a component (such as a subsystem, or a masked block) that is contained in a library. Such a library is a container and can contain multiple references. In contrast, a direct reference (for example, "model reference" in Simulink®) refers to another component directly in the referring model. In model reference the component is a model, however, the defining characteristic of a direct reference is that it links to a separate unit without a making use of a container. Unlike a library block, the model of a direct reference can be simulated. One of ordinary skill in the art will appreciate that the present description relies upon the model reference and the library reference for illustrative purposes only. There can be other types of references, including transparent local references that within a single model have the same subsystem or block used multiple times by referencing the subsystem or block internally within the model.

Figure 20:
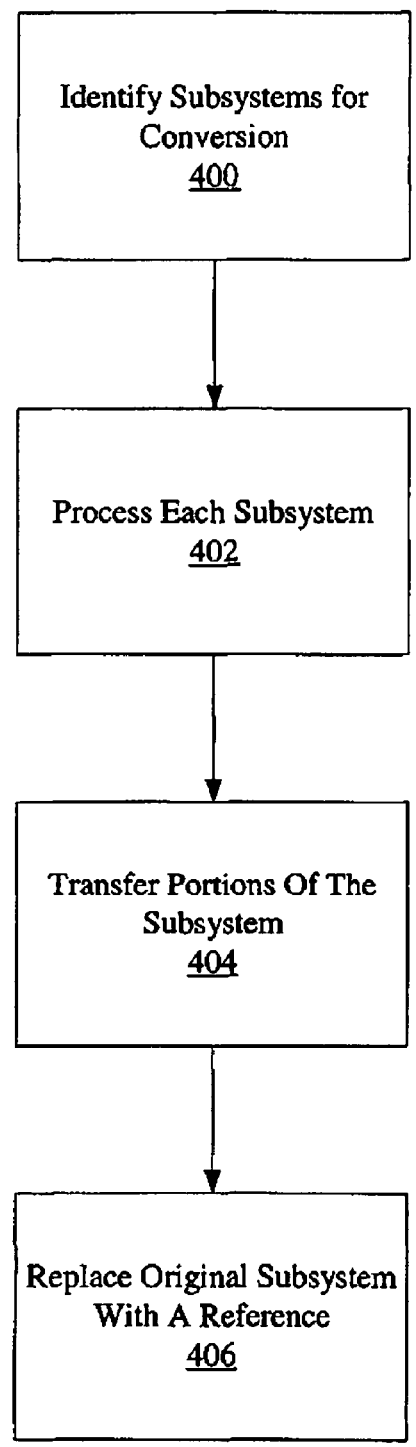
FIG. 20 is a flowchart illustrating a method of automatically converting subsystems to references, in accordance with one embodiment of the present invention.

FIG. 20 is a flowchart illustrative of a method in accordance with one embodiment of the present invention that automatically partitions a graphical model into a hierarchy of models. The method describes conversion to direct reference models. The method includes finding a subsystem to convert (step 400). Prior to this step, the method can include compiling the original model so that access is gained to data such as the data types, dimensions, sample times, and the like. However, the method by which access is provided to this information is not crucial to the invention; thus the step of compiling the model has not been included in the required steps of the inventive method.

The process for finding a subsystem to convert can take many different forms. The process can generally be carried out through the application of heuristics. A straightforward approach that leads to an intuitive partitioning is the use of subsystems as introduced by the model designer in the model to be processed. These subsystems can be found by invoking an algorithm such as the "find_system" command found in Simulink® on the original model. According to the Simulink® manual, the "find_system (sys, 'c1', cv1, 'c2', cv2, . . . 'p1', v1, 'p2', v2, . . . )" command searches the systems or subsystems specified by "sys", using the constraints specified by c1, c2, etc., and returns handles or paths to the objects having the specified parameter values v1, v2, etc. The variable "sys" can be a pathname (or cell array of pathnames), a handle (or vector of handles), or can be omitted. If "sys" is a pathname or cell array of pathnames, find_system returns a cell array of pathnames of the objects it finds. If "sys" is a handle or a vector of handles, find_system returns a vector of handles to the objects that it finds. If "sys" is omitted, find_system searches all open systems and returns a cell array of pathnames. The find_system command, as understood by one of ordinary skill in the art, uses standard sorting and searching mechanisms to locate components in the form of subsystems having selected characteristics. The actual process utilized in the search method can vary, and is well understood by one of ordinary skill in the art. Once the list of atomic subsystems is created, the list is further reduced based on additional qualifications needed for a system to be converted into a reference. For example, when converting to a model reference, the system may not have a trigger port.

An alternative heuristic approach applies pre-determined patterns of connected blocks that are often found in models where the patterns can be made domain-dependent or entered by the user. A pattern matching approach then identifies and compiles the prescribed patterns.

In accordance with another heuristic approach, a heuristic analysis is implemented that finds blocks of a given type (and/or with given parameters, etc.) to use as a cornerstone of the matching. The analysis algorithm then searches up and down from each of the cornerstone blocks while matching their connected blocks. As long as there are patterns that are similar, further connected blocks can be included, potentially up to a predetermined limit. The limit can be selected either by the user or an automated evaluation mechanism. Likewise, the limit can be generated adaptively, evaluating the trade-off between few large referenced parts or many small referenced parts, or many referenced parts with many fixed properties vs. few referenced parts with few fixed properties.

Still another variation to the heuristic analysis concentrates only on chains of blocks (i.e., singly connected blocks) where each block in a model is considered the start of a chain that is extended by blocks connected thereto, as long as there are similar patterns. Instead of a chain of blocks, an acyclic graph of blocks, or a tree may be applied as well.

In each of the different heuristic processes to identify potentially re-usable patterns, similarities are identified, rather than requiring identical patterns. This is because polymorphism can handle structurally identical patterns that have differences in their polymorph characteristics such as sample time and data type. Also, patterns that include modeling constructs not amenable to re-use should be precluded in the partitioning process. These modeling constructs may depend on the type of reference that is to be applied and are listed along with their restrictions to validate the identified reusable patterns, as understood by one of ordinary skill in the art. In addition, it should be noted that the different heuristic processes can be utilized to identify patterns that are similar among a plurality of components, or patterns based on selected characteristics against which the model is compared. Thus, a plurality of components can result that require conversion to a reference, or a single component can result that matches a selected pattern or characteristic, and that single component thus requires conversion to a reference.

A mechanism that can be utilized to identify similarities is the "checksum" process. A checksum is an identifier that captures the identicality of a number of particular characteristics. For example, the "topological checksum" captures the types of blocks and their interconnections in a pattern. Any two patterns with identical checksums have identical such structures. The "structural checksum", on the other hand, includes structural identicality as well as whether the data types, sample times, signal dimensions, and the like, are identical. Such checksums are known by those of ordinary skill in the art, and can be conveniently implemented to complete a portion of the method of the present invention.

Alternatively, "partitioning specific checksums" can be computed that explicitly take into account the trade-off between similarity and re-usability. With the use of a partitioning specific checksum, a spectrum of increasingly comprehensive checksums can be applied, such as those where sample times are, and are not, included.

Instead of using a checksum based mechanism, a more direct approach can be applied that compares blocks and their attributes between the patterns identified to be similar. This mechanism can then be integrated into the identification step 400, where potentially reusable patterns are identified.

A more sophisticated approach compiles the potentially reusable patterns into linked lists of parameter data that can then be compared to establish identicality within a degree of polymorphism. If such an approach is utilized, a decision mechanism is required to determine the degree of polymorphism and whether a direct or indirect reference should be used. The degree of polymorphism is closely related to the re-usability of patterns, but may have undesirable effects in the later design stages where increasingly rigid interface specifications are applied. Therefore, user interaction may have to be solicited. Also, the use of direct and indirect references has a different bearing on, e.g., cooperative engineering practices. Therefore, model transcending criteria may determine which to apply. Again, user interaction may be solicited to aid in making the determination.

Figure 21:
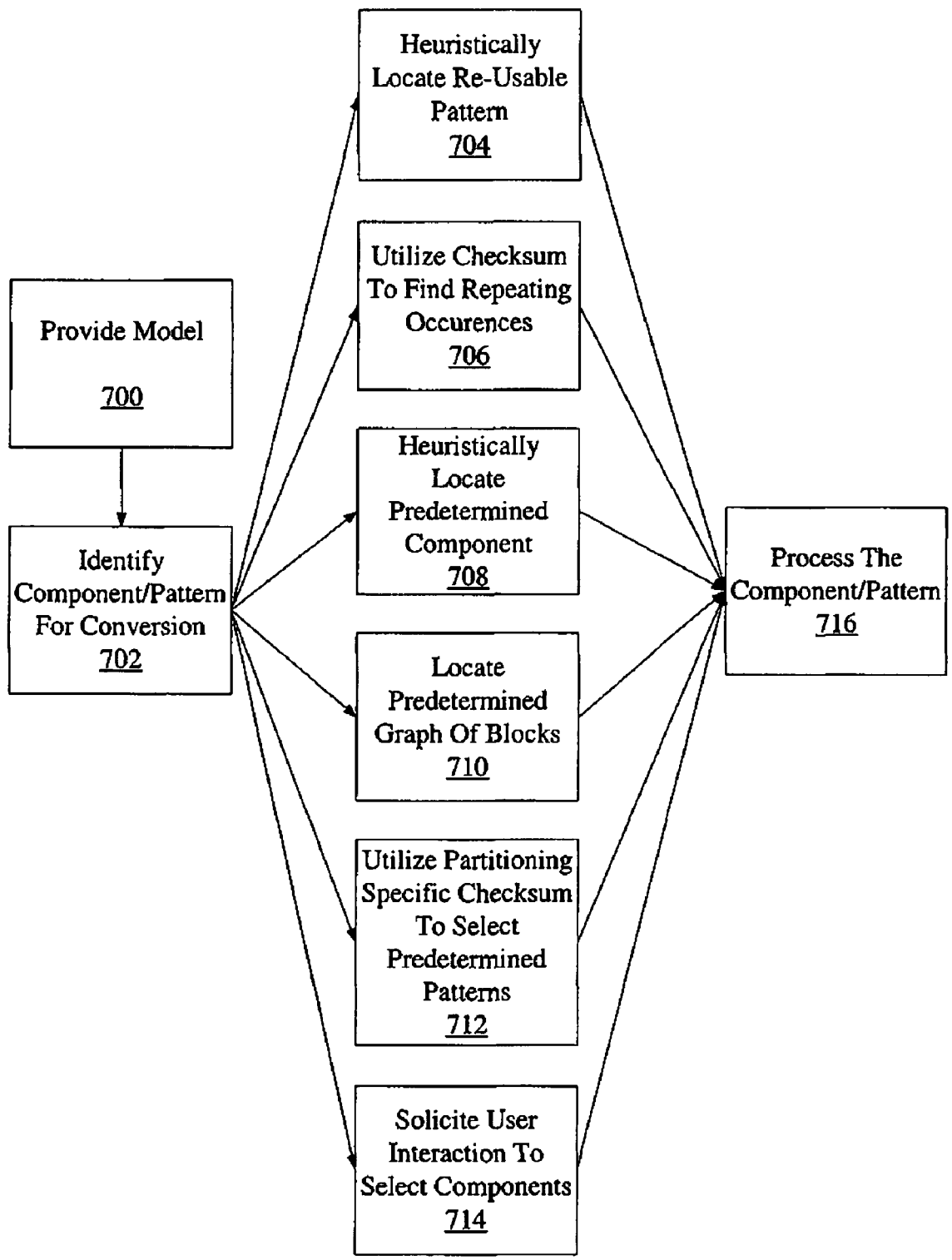
FIG. 21 is a flowchart illustrating different identification methods, according to aspects of the present invention.

FIG. 21 is a flowchart illustrating some of the above described methods that can be used in identifying the component or pattern for conversion to a reference in accordance with the present invention. More specifically, in the described process, a model is provided (step 700). Identification of a component or pattern is performed to find a component, multiple components, or patterns appropriate for conversion (step 702). As illustrated, there are a number of different paths that can be taken, or a number of different methods that can be utilized, to identify components or patterns. The different methods include, but are not limited to, heuristically locating re-usable patterns (step 704), utilizing checksums to find repeating occurrences (step 706), heuristically locating pre-determined components (step 708), locating a predetermined acyclic graph of blocks (step 710), utilizing a partitioning specific checksum to select predetermined patterns (step 712), or soliciting user interaction to select components (step 714). The method continues with processing the component or pattern (step 716) as described below. One of ordinary skill in the art will appreciate that the present invention is not limited to the above described methods, nor are the methods particularly limited to use with components verses patterns. Instead, the present invention anticipates the use of a number of different processes, or algorithms, for identifying a single component, multiple components, or patterns for conversion.

The method illustrated in FIG. 20 continues with processing each subsystem (step 402) and potentially converting the subsystem into a reference. The step of processing is shown in more detail in the flowchart of FIG. 22 for generation of a direct reference. Again, a direct reference refers to another model as being a subsystem in the referring model. First, the method determines whether the subsystem matches a previously converted subsystem (step 410). If there is a match with a previously converted subsystem, then there is no need to proceed with the conversion. If the subsystem does not match with a previously converted subsystem, the method proceeds with creating a new model (step 412). The name of the new model can be derived from the name of the subsystem (if named).

At least a portion of the contents of the subsystem is copied into the new model (step 414). The portion of the subsystem that is copied into the new model depends upon what is defined as the subsystem. As such, the invention is not limited to copying an entirety of an arbitrarily defined subsystem. The portion of the contents of the subsystem that is copied is the portion that relates to the repeated pattern, or repeated functionality, found in other areas of the model, and the portion includes sufficient elements for the portion to operate as its own model or subsystem.

Input ports are then selected (step 416) and input port attributes are set with the values from the original after all of the propagations (e.g. data types, dimensions) have been completed (step 418). The attributes set are those required to lock down the propagation of the attributes required for the desired level of polymorphism. If there are any unprocessed input ports, the selection of ports, and provision of port attributes is repeated as necessary (step 420). Subsequent to processing all of the input ports, the output ports are selected (step 422) and attributes are set (step 424). Again, the process repeats for additional unprocessed output ports (step 426).

Figure 22:
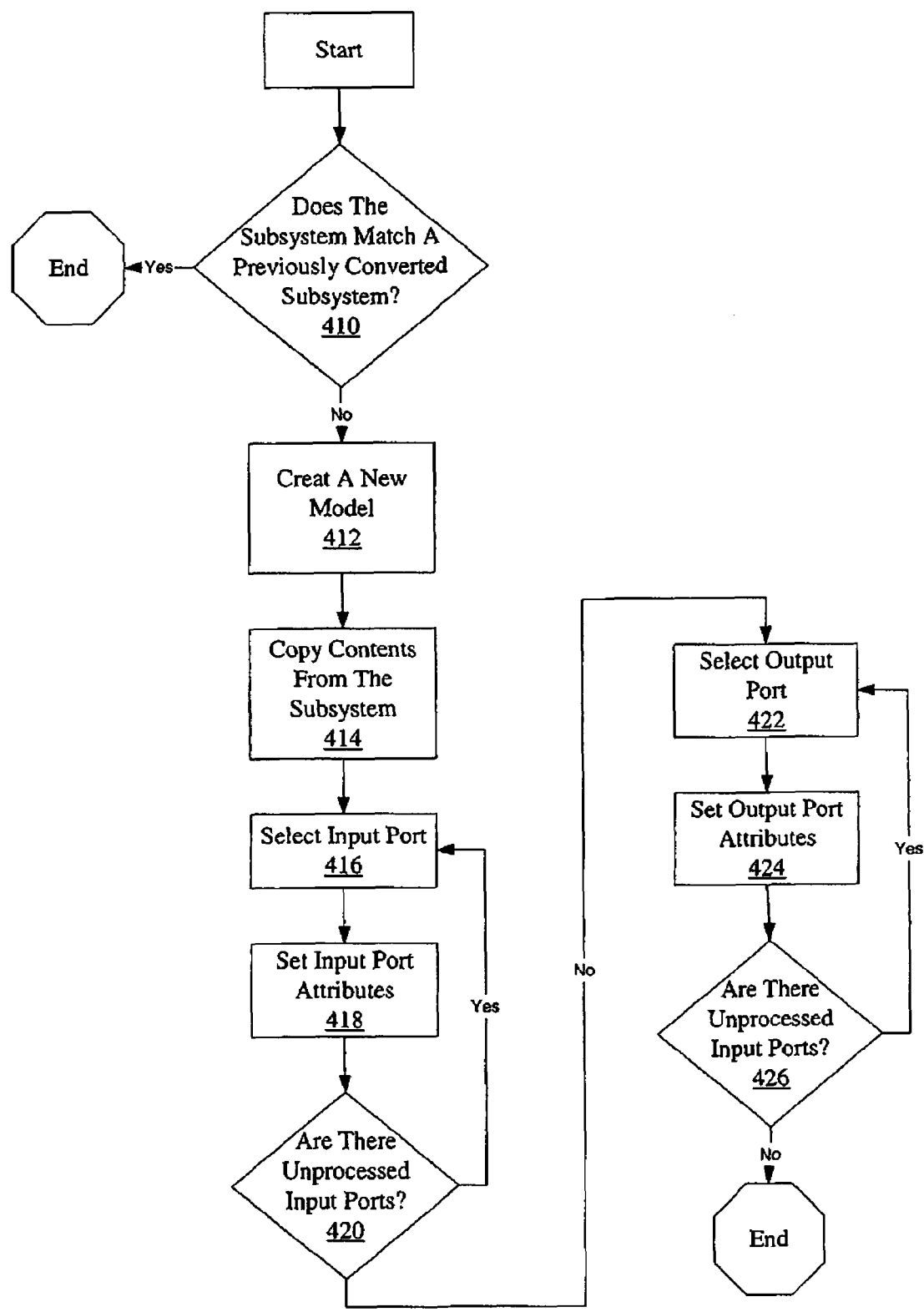
FIG. 22 is a flowchart illustrating processing a subsystem, in accordance with one aspect of the present invention.
Figure 23:
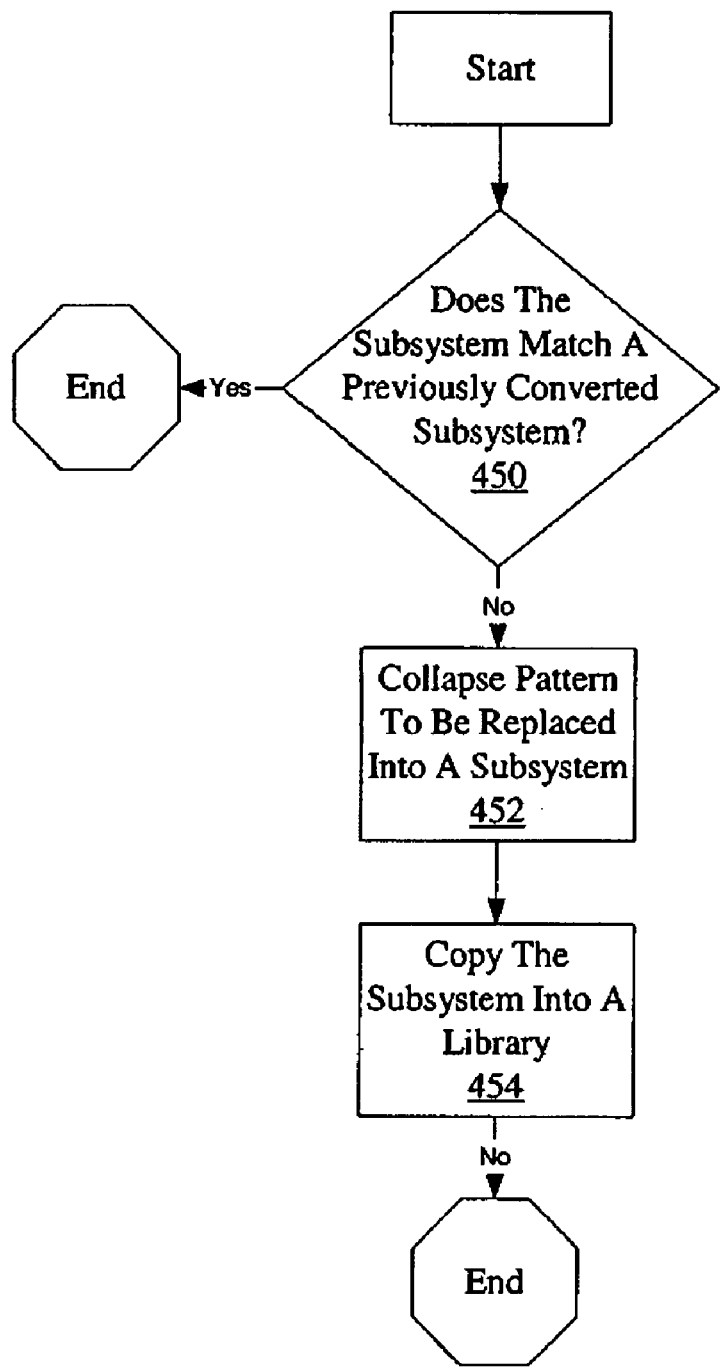
FIG. 23 is a flowchart illustrating processing a subsystem, in accordance with one aspect of the present invention.

FIG. 23 illustrates another embodiment by which an indirect reference is created to replace a subsystem in accordance with the present invention. Again, an indirect reference refers to a subsystem that is contained in a library. As with FIG. 22, FIG. 23 represents a more detailed view of step 402 of FIG. 20 (i.e., the processing of subsystems). The method determines whether the subsystem to be converted matches a previously converted subsystem (step 450). If there is a match, the processing portion of the method is complete. If there is no match, the method collapses the pattern to be converted into a new subsystem within the original graphical model (step 452). The new subsystem is then copied to a library (step 454). The library can be an existing library, or a new library is created to hold the new subsystem. The processing of the subsystem is then complete, and the method continues with step 404, saving the subsystem or model under a new name in the library.

As illustrated, the procedure for creating an indirect reference is similar to, but different from, a direct reference. The pattern to be replaced is first collapsed into a subsystem, all within the original model. Next, for an indirect reference, the subsystem is copied to a library, either existing or newly created, whereas for a direct reference the contents of the system are copied to a newly created model. Then the originally generated subsystem instance is replaced with a corresponding reference, and all like patterns are processed by replacing them with a reference to this subsystem.

Figure 24:
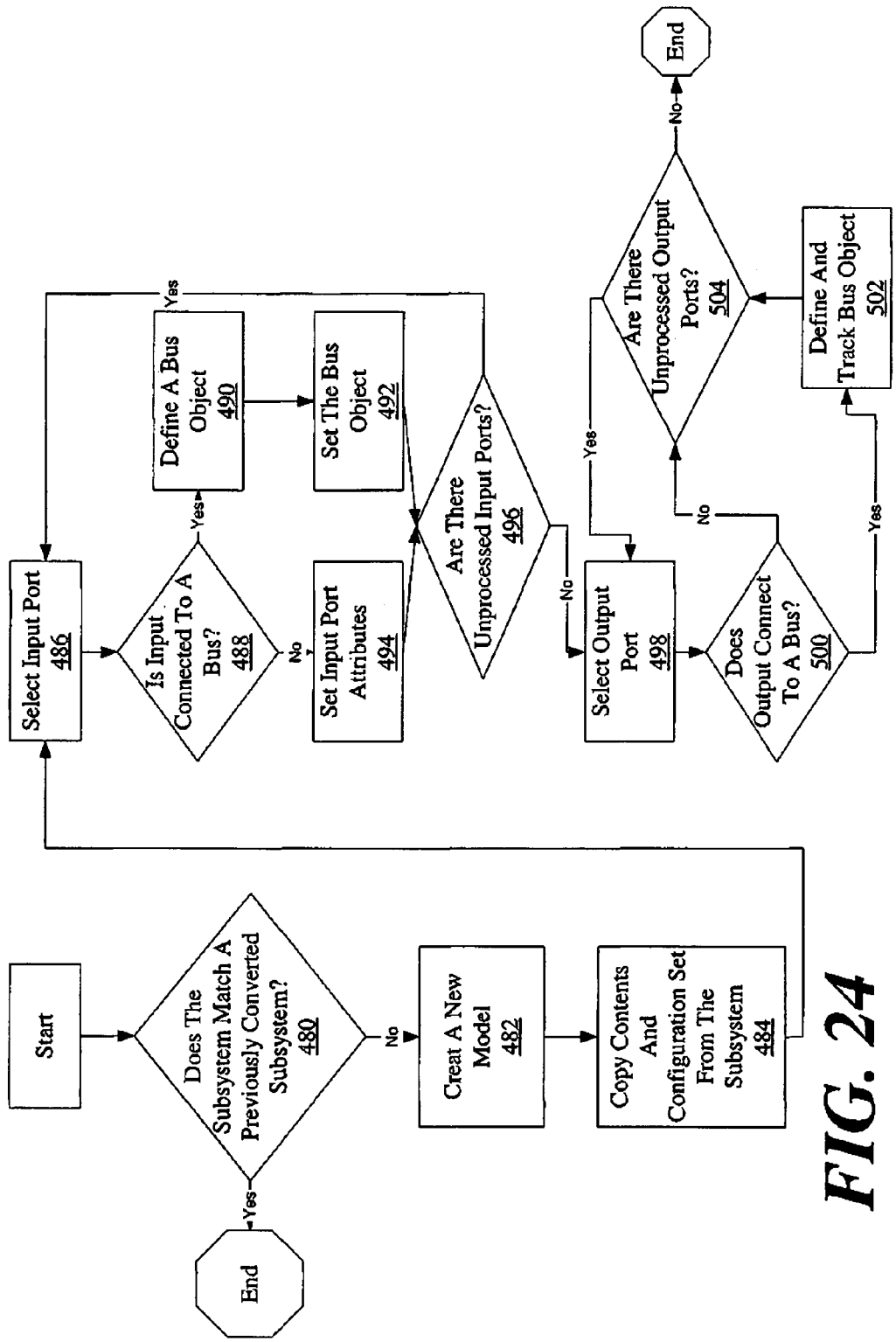
FIG. 24 is a flowchart illustrating an entire conversion process, in accordance with one aspect of the present invention.

FIG. 24 is a flowchart illustrating still another embodiment of the present invention with respect to the processing step (step 402) of FIG. 20. FIG. 24 shows the details of processing a single exemplary subsystem being converted to a model with a direct reference. First, a determination is made as to whether the current subsystem is the same as a subsystem that has already been converted (step 480), if not, then conversion proceeds. A new model is created with the contents of the subsystem and the original model's configuration set (e.g. solver data, logging options, etc.) (steps 482 and 484).

An input port is selected (step 486), and a determination is made whether the input port connects with a bus (step 488). If there is a bus connection, a bus object is defined (step 490) and the bus object is set (step 492). If there is no bus connection, pertinent input port attributes are set (step 494). Thus, each input port has all of the pertinent information set for it, including defining any needed bus objects. Additional input ports are then identified, if any, for processing (step 496).

Then an output port is selected (step 498), and a determination is made whether the output port connects with a bus (step 500). If there is a bus connection, a bus object is defined and tracked (step 502). If there is no bus connection, additional unprocessed output ports are identified, if any, for processing (step 504). Each output port then has a bus object defined for it if needed.

The method of FIG. 20 continues by replacing the subsystem or subsystems with references (step 406). Once a pattern for re-use is selected, it has to be replaced in the model by a reference and this reference and its contents have to be created. These two stages are executed in reverse order. As previously mentioned, FIG. 20 illustrates the method relating to conversion into a direct reference. Specifically, a new "empty" model was created. The blocks that comprise the pattern were then copied to this new model and next the compiled properties that are to be fixed (i.e., not subjected to polymorphism) were set on the input and output ports. To complete the generation of the reference, the configuration set was copied from the original model. This configuration sets holds model peripheral information such as the numerical solver to be used, start and stop times, code generation target, and the like. Now the method progresses by processing all like patterns by replacing them with a reference to the newly created model (which is step 406).

Figure 25:
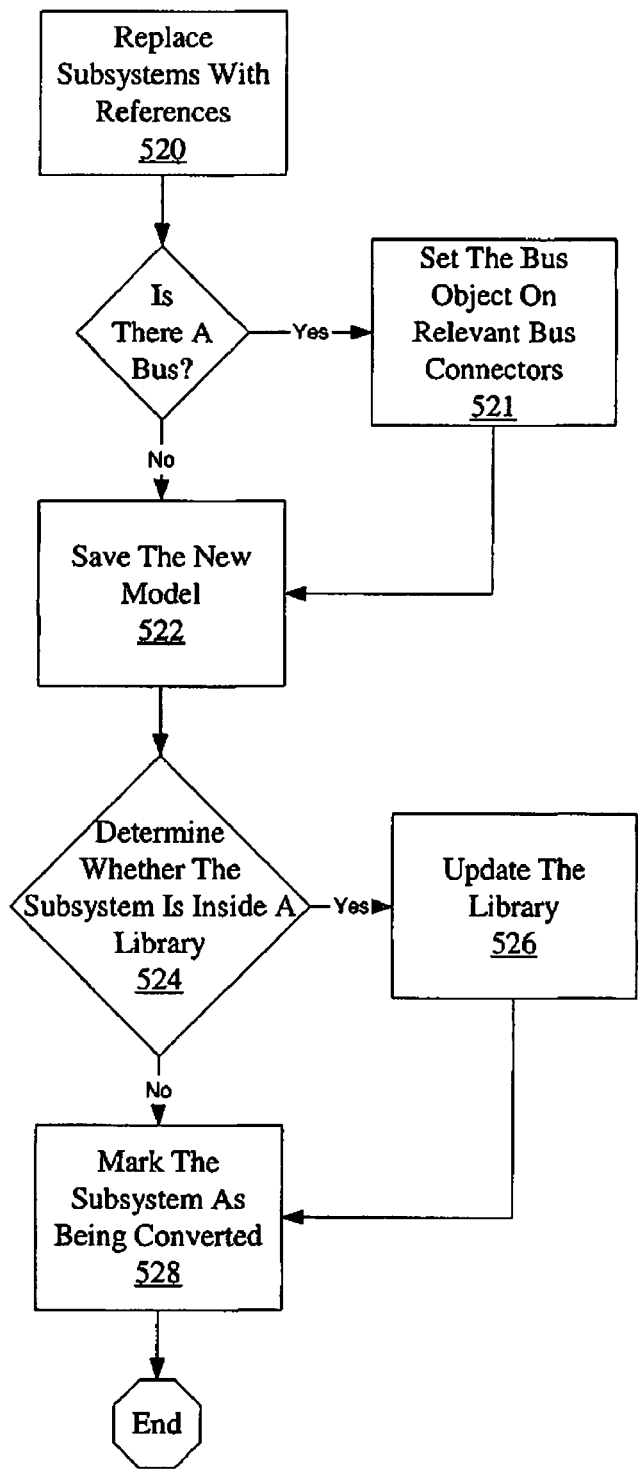
FIG. 25 is a flowchart illustrating the method of replacing a model or library block with a reference.

FIG. 25 illustrates a more detailed flowchart of the complete process involved for generating references. After the subsystem or model is replaced with a reference (step 520), if there are buses involved, the bus object is set on relevant bus creators (step 521). Regardless of whether there are buses, the new model is saved (step 522). The determination is made whether the subsystem is inside a library (step 524). If the subsystem is inside a library, the library is updated with the new model or subsystem information (step 526). The method marks the subsystem as having been converted (step 528). Thus, if further analysis of the larger graphical model reveals a same or similar subsystem, the conversion process does not repeat. Instead, a reference is simply put in place of the duplicate subsystem to the new, but existing, model.

Any subsystems in this subsystem that have been previously converted to models, are thus replaced with direct references, for example, model blocks. It should be noted that the algorithm that finds the systems to convert sorts them so that the most deeply nested are first. Any bus creators have bus objects specified on them as needed. If the subsystem is inside a library, then the library is updated to make use of the model block. Lastly the system is marked as converted so it will be on the list for further systems to be checked against for identity. If there are any bus objects, such objects are saved to a definition file.

Figure 26:
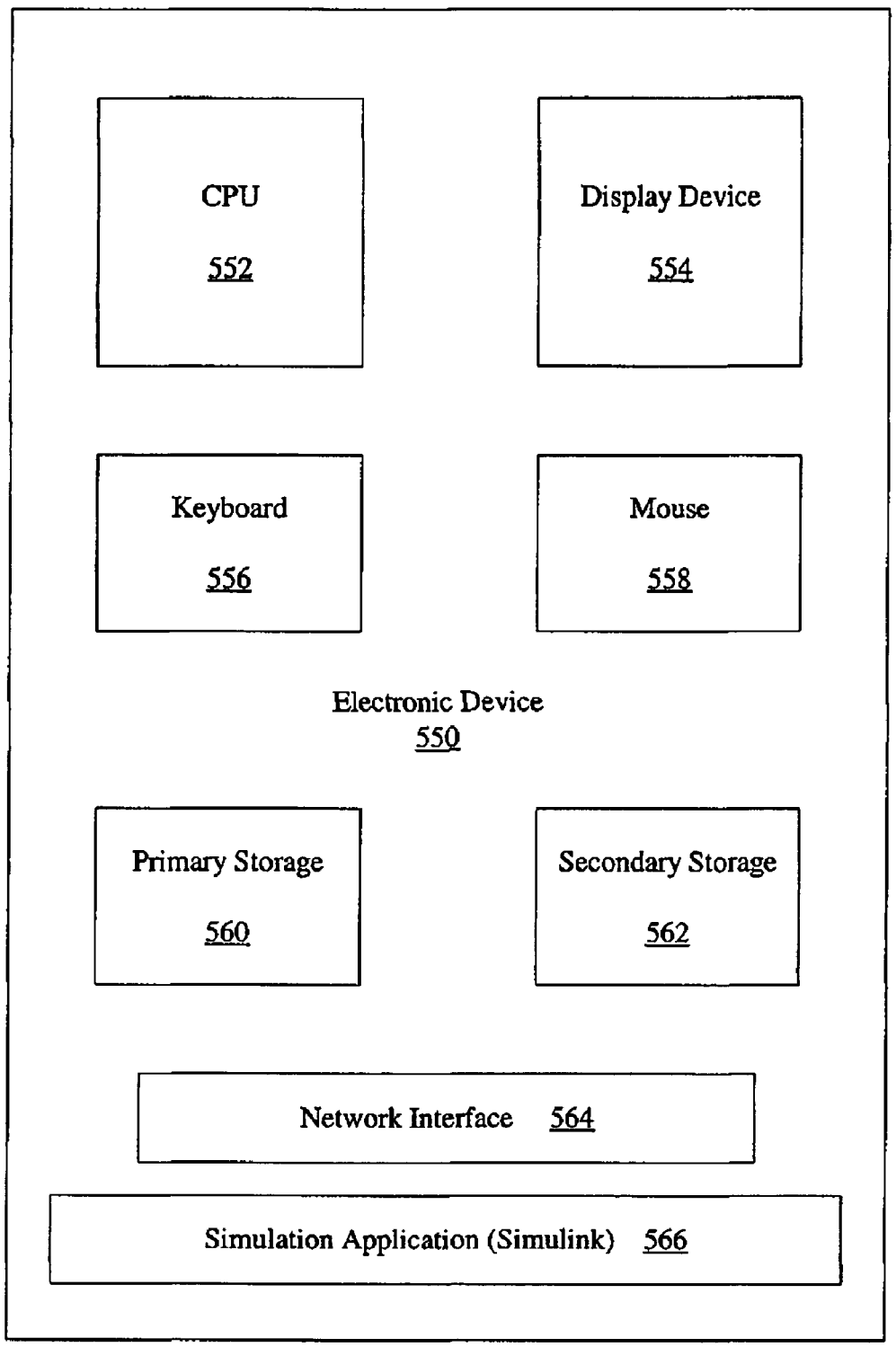
FIG. 26 is a diagrammatic illustration of an electronic device that can be utilized to execute the method of the present invention.

FIG. 26 illustrates one example embodiment of an electronic device 550 suitable for practicing the illustrative embodiments of the present invention. The electronic device 550 is representative of a number of different technologies, such as personal computers (PCs), laptop computers, workstations, personal digital assistants (PDAs), Internet appliances, cellular telephones, and the like. In the illustrated embodiment, the electronic device 550 includes a central processing unit (CPU) 552 and a display device 554. The display device 554 enables the electronic device 550 to communicate directly with a user through a visual display. The electronic device 550 further includes a keyboard 556 and a mouse 558. Other potential input devices not depicted include a stylus, trackball, joystick, touch pad, touch screen, and the like. The electronic device 550 includes primary storage 560 and secondary storage 562 for storing data and instructions. The storage devices 560 and 562 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 560 and 562. The electronic device 550 can also include a network interface 564 for communicating with one or more electronic devices external to the electronic device 550 depicted. A modem is one form of network interface 564 for establishing a connection with an external electronic device or network. The CPU 552 has either internally, or externally, attached thereto one or more of the aforementioned components. In addition to applications previously mentioned, modeling applications, such as Simulink® 566, can be installed and operated on the electronic device 550.

It should be noted that the electronic device 550 is merely representative of a structure for implementing the present invention. However, one of ordinary skill in the art will appreciate that the present invention is not limited to implementation on only the described device 550. Other implementations can be utilized, including an implementation based partially or entirely in embedded code, where no user inputs or display devices are necessary. Rather, a processor can communicate directly with another processor or other device.

One of ordinary skill in the art will additionally appreciate that the above-described method can have a number of different embodiments and alternatives which are anticipated by the present invention. For example, the approach can be of a free-form type, where general recurring patterns are sought during the identification phase. This approach can make use of heuristics to achieve a manageable computational complexity.

A computationally more efficient approach but conceptually somewhat different leverages the subsystems as present in the model already. The approach assumes that all models contain some form of hierarchy as embodied by the subsystems, for example, in Simulink®. These subsystems are an intuitive decomposition for the model designer and, as such, present an advantageous starting point for the model simplification method. The model designer can choose the subsystems to be functionally minimally connected. The simplification in this instance seamlessly fits the original design, therefore, the simplification does not introduce hurdles that hamper the user's understanding of the model.

In addition to looking for free-form patterns and comparing subsystems, a mixture of both approaches can be utilized. For example, predetermined patterns can be searched in a model that are not necessarily a subsystem. More specifically, filter models have a number of recurring patterns that may be present. Such patterns can be quickly found in a model and replaced by reference to a functionally equivalent unit.

It should be noted that the functional equivalence is an important factor for the present invention. However, changes in formalism can also be included. For example, a graphical representation of a linear discrete time model can be replaced by its algebraic equivalent that communicates with the rest of the graphical model through a graphical model interface. In such an instance, the appearance can be that of, e.g., a block, but its internals are a system of state space equations (or a reference to that) instead of a graphical implementation of a state space model.

Also, one of ordinary skill in the art will recognize that the invention applies equally well to small or more extensive changes to the replacing functionality. For example, a repeated pattern of nonlinear behavior can be linearized and this linear version can be used to reference.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. In a computing device, a method of altering a graphical model of an engineered system, the method comprising:

identifying, using the computing device, a component of the graphical model for conversion into a reference, the component being identified based on one or more selected characteristics or an application of one or more heuristics;

processing, using the computing device, the component to identify a pattern of one or more similarities with one or more other components or one or more similarities of one or more selected characteristics;

replacing, using the computing device, a similar pattern or a set of selected characteristics of a representation of the component with a reference to a previous occurrence of that similar pattern or the set of selected characteristics in a representation of any other component; and storing the reference and contents of the representation of the any other component in the computing device for coordinating a graphical modeling process.

2. The method of claim 1, wherein the component comprises at least one of a system, a sub-system, a portion of a system, or a portion of a sub-system disposed within the graphical model.

3. The method of claim 1, wherein identifying the component further comprises:

heuristically locating a re-usable pattern; and identifying the component based on the located re-usable pattern.

4. The method of claim 1, wherein identifying the component further comprises:

identifying the similar pattern utilizing a checksum, the checksum being an identifier that captures a set of characteristics; and identifying the component based on the identified similar pattern.

5. The method of claim 1, wherein identifying the component further comprises:
heuristically locating a specific type of component; and
identifying the component based on the located specific type.

6. The method of claim 1, wherein identifying the component further comprises:
locating a selected acyclic graph of blocks; and
identifying the component based on a location of the selected acyclic graph of blocks.

7. The method of claim 1, wherein identifying the component further comprises:
selecting a predetermined combination of selected patterns and selected re-usable features of the component utilizing a partitioning specific checksum; and
identifying the component based on the selected predetermined combination of selected patterns and the selected re-usable features of the component.

8. The method of claim 1, wherein identifying the component further comprises:
identifying the component based on at least one of pattern matching, re-usability, and polymorphism characteristics.

9. The method of claim 1, further comprising:
creating a new graphical model of the engineered system; and
copying the component of the graphical model into the new graphical model.

10. The method of claim 9, further comprising:
copying a configuration set from the graphical model, the copying for converting the component into a reference for the new graphical model, the configuration set including model peripheral information.

11. The method of claim 10, further comprising:
replacing the one or more other components with one or more references to the new graphical model.

12. The method of claim 1, further comprising:
incorporating the component into a subsystem within the graphical model.

13. The method of claim 12, further comprising:
creating a copy of the subsystem in a library.

14. The method of claim 13, further comprising:
replacing the subsystem with a reference to the copy of the subsystem in the library.

15. The method of claim 14, further comprising:
replacing one or more other subsystems with one or more references to the copy of the subsystem in the library.

16. The method of claim 1, wherein the reference further comprises at least one of a library reference or a model reference.

17. A computer-implemented method comprising:
selecting, using a computing device, a portion of a first graphical model, the selected portion converted into a reference using at least one of:
heuristically locating, using the computing device, a pattern in the first graphical model and selecting the portion of the first graphical model as representing the pattern,
identifying, using the computing device, a selected pattern in the first graphical model utilizing a checksum and selecting the portion of the first graphical model as matching the selected pattern, the checksum being an identifier that captures one or more characteristics of the first graphical model,
heuristically locating, using the computing device, a specific type of component in the first graphical model and selecting the portion of the first graphical model as matching the specific type of component,
locating, using the computing device, an acyclic graph of one or more blocks in the first graphical model and selecting the portion of the first graphical model as including the acyclic graph of the one or more blocks,
selecting, using the computing device, a combination of selected patterns utilizing a partitioning specific checksum and selecting the portion of the first graphical model as matching the combination of selected patterns, and
selecting, using the computing device, the portion of the first graphical model based on at least one of pattern matching, re-usability, and polymorphism characteristics;
transferring, using the computing device, the selected portion of the first graphical model to a library;
replacing, using the computing device, the selected portion of the first graphical model with a reference to a location in the library; and
storing the first graphical model in the computing device, the stored first graphical model for coordinating a graphical modeling process.

18. The computer-implemented method of claim 17 further comprising:
identifying a second portion of a second graphical model that is similar to the selected portion of the first graphical model; and
replacing the second portion of the second graphical model with the reference to a location in the library.

19. A computer-implemented method comprising:
identifying, using a computing device, a portion in a first graphical model based on one or more selected characteristics or a pattern of one or more similarities;
generating, using the computing device, a second graphical model based on the first graphical model, the second graphical model being functionally equivalent to the first graphical model;
identifying, using the computing device, one or more portions in the second graphical model that are similar to the identified portion in the first graphical model;
replacing, using the computing device, the identified one or more portions in the second graphical model with a reference to a location, in the first graphical model, of the identified portion of the first graphical model; and
storing the second graphical model in the computing device for coordinating a graphical modeling process.

20. The computer-implemented method of claim 19 wherein the reference to the location of the identified portion of the first graphical model includes a reference to a location in a third graphical model that includes the identified portion of the first graphical model or a reference to a location in a library that includes the identified portion of the first graphical model.

* * * * *

UNITED STATES PATENT AND TRADEMARK OFFICE
CERTIFICATE OF CORRECTION

PATENT NO. : 7,567,890 B1 Page 1 of 1
APPLICATION NO. : 11/879228
DATED : July 28, 2009
INVENTOR(S) : Arwen Warlock It is certified that error appears in the above-identified patent and that said Letters Patent is hereby corrected as shown below:

At column 8, line 55 (Specification) of the printed patent, "rhay" should be --may--.

Signed and Sealed this

First Day of December, 2009

David J. Kappos
*Director of the United States Patent and Trademark Office*